(12) United States Patent
Mirzaei et al.

(10) Patent No.: US 8,301,101 B2
(45) Date of Patent: Oct. 30, 2012

(54) FREQUENCY TRANSLATED FILTER

(75) Inventors: Ahmad Mirzaei, Costa Mesa, CA (US);
Hooman Darabi, Irvine, CA (US); John Leete, Huntington Beach, CA (US)

(73) Assignee: Broadcom Corporation, Irvine, CA (US)

( * ) Notice: Subject to any disclaimer, the term of this patent is extended or adjusted under 35 U.S.C. 154(b) by 504 days.

(21) Appl. No.: 12/470,789

(22) Filed: May 22, 2009

(65) Prior Publication Data

US 2010/0267354 A1    Oct. 21, 2010

Related U.S. Application Data

(60) Provisional application No. 61/170,398, filed on Apr. 17, 2009.

(51) Int. Cl.
*H04B 1/18* (2006.01)
*H04B 1/10* (2006.01)

(52) U.S. Cl. ......... 455/293; 455/307; 455/311; 455/339

(58) Field of Classification Search .................. 455/280, 455/283, 286, 293, 296, 307, 311, 338, 339
See application file for complete search history.

(56) References Cited

U.S. PATENT DOCUMENTS

| | | | |
|---|---|---|---|
| 5,434,541 A | 7/1995 | Knoedl | |
| 5,678,226 A | 10/1997 | Li et al. | |
| 6,141,371 A | 10/2000 | Holmes et al. | |
| 7,248,844 B2 | 7/2007 | Rofougaran | |
| 7,764,942 B2 | 7/2010 | Bayruns | |
| 7,809,349 B1 | 10/2010 | Granger-Jones et al. | |
| 2008/0014896 A1* | 1/2008 | Zhuo et al. | ..................... 455/326 |
| 2008/0083967 A1 | 4/2008 | Nakatani et al. | |
| 2008/0175307 A1 | 7/2008 | Brunn et al. | |
| 2009/0133252 A1 | 5/2009 | Drapkin et al. | |
| 2009/0191833 A1 | 7/2009 | Kaczman et al. | |
| 2010/0255791 A1 | 10/2010 | Vazny et al. | |
| 2010/0317308 A1 | 12/2010 | Mirzaei et al. | |
| 2010/0317311 A1 | 12/2010 | Mirzaei et al. | |
| 2011/0003569 A1 | 1/2011 | Mirzaei et al. | |
| 2011/0003572 A1 | 1/2011 | Mirzaei et al. | |
| 2011/0092176 A1* | 4/2011 | Molnar et al. | ................ 455/320 |

FOREIGN PATENT DOCUMENTS

EP        2270982 A2      1/2011

OTHER PUBLICATIONS

Darabi, "A Blocker Filtering Technique for SAW-Less Wireless Receivers," IEEE Journal of Solid-State Circuits, vol. 42, No. 12, pp. 2766-2773, Dec. 2007.

(Continued)

*Primary Examiner* — Nguyen Vo
(74) *Attorney, Agent, or Firm* — Sterne, Kessler, Goldstein & Fox P.L.L.C.

(57) ABSTRACT

Embodiments of a frequency translated filter (FTF) are presented. An FTF includes a passive mixer and a baseband impedance. The baseband impedance includes a network of one or more passive components (e.g., resistors, inductors, and capacitors) that form a low-Q filter. The passive mixer is configured to translate the baseband impedance to a higher frequency. The translated baseband impedance forms a high-Q filter and is presented at the input of the FTF. The FTF can be fully integrated in CMOS IC technology (or others, e.g., Bipolar, BiCMOS, and SiGe) and applied in wireless receiver systems including GSM, Wideband Code Division Multiple Access (WCDMA), Bluetooth, and wireless LANs (e.g., IEEE 802.11).

29 Claims, 13 Drawing Sheets

OTHER PUBLICATIONS

Mirzaei at al., "A Low-Power WCDMA Transmitter With an Integrated Notch Filter," IEEE Journal of Solid-State Circuits, vol. 43, No. 12, pp. 2868-2881, Dec. 2008.

Darabi, "A Blocker Filtering Technique for Wireless Receivers," International Solid-State Circuits Conference 2007, Session 4, RF Building Blocks, 4.4, pp. 84-86, Feb. 12, 2007.

* cited by examiner

FREQUENCY TRANSLATED FILTER

CROSS-REFERENCE TO RELATED APPLICATIONS

The present application claims the benefit of U.S. Provisional Patent Application No. 61/170,398, filed Apr. 17, 2009, which is incorporated herein by reference in its entirety.

FIELD OF THE INVENTION

This application relates generally to filters and, more specifically, to high quality factor (Q) filters.

BACKGROUND

There exist two commonly implemented front-end architectures in radio frequency (RF) receiver design; namely, the homodyne architecture and the heterodyne architecture. The homodyne architecture down-converts a desired channel directly from RF to baseband, whereas the heterodyne architecture down-converts a desired channel to one or more intermediate frequencies (IF) before down-conversion to baseband. In general, each of these front-end architectures employ an antenna to receive an RF signal, a band-pass filter to suppress out-of-band interferers in the received RF signal, a low noise amplifier (LNA) to provide gain to the filtered RF signal, and one or more down-conversion stages.

Each component in a receiver front-end contributes noise to the overall system. The noise of a component can be characterized by its noise factor (F), which is given by the ratio of the SNR at the input of the component to the SNR at the output of the component:

$$F_{COMPONENT} = SNR_{IN}/SNR_{OUT}$$

The noise of the overall receiver front-end increases from input to output as noise from successive components compound. In general, the overall noise factor of the receiver front-end is proportional to the sum of each component's noise factor divided by the cascaded gain of preceding components and is given by:

$$F_{TOTAL} = F_1 + \frac{F_{2-1} - 1}{A_1} + \frac{F_{3-1} - 1}{A_1 A_2} + \ldots + \frac{F_{n-1} - 1}{A_1 A_2 \ldots A_{n-1}}$$

where $F_n$ and $A_n$ represent the noise factor and gain of the nth component in the receiver front-end, respectively. The above equation reveals that the noise factor ($F_1$) and gain ($A_1$) of the first gain component can have a dominant effect on the overall noise factor of the receiver front-end, since the noise contributed by each successive component is diminished by the cascaded gain of the components that precede it.

To provide adequate sensitivity, therefore, it is important to keep the noise factor ($F_1$) low and the gain ($A_1$) high of the first gain component in the receiver front-end. The sensitivity of the receiver front-end determines the minimum signal level that can be detected and is limited by the overall noise factor of the receiver front-end. Thus, in typical receiver designs the first gain component in the front-end is an LNA, which can provide high gain, while contributing low noise to the overall RF receiver.

LNAs provide relatively linear gain for small signal inputs. However, for sufficiently large input signals, LNAs can exhibit non-linear behavior in the form of gain compression; that is, for sufficiently large input signals, the gain of the LNA approaches zero. LNA gain compression is a common issue confronted in RF receiver design, since large out-of-band interferers referred to as blockers can accompany a comparatively weak desired signal in a received RF signal. For example, in the Global System for Mobile Communications (GSM) standard, a desired signal 3 dB above sensitivity (−102 dBm) can be accompanied by a 0 dBm blocker as close as 80 MHz away. If these large out-of-band interferers are not attenuated prior to reaching the LNA, they can reduce the average gain of the LNA. As noted above, a reduction in the gain provided by the LNA leads to an increase in the noise factor of the receiver front-end and a corresponding degradation in sensitivity.

Therefore, a band-pass filter is conventionally employed in the receiver front-end, before the LNA, to attenuate large out-of-band interferers. These filters are typically mechanically-resonant devices, such as surface acoustic wave (SAW) filters, that provide a high quality factor (Q) required by many of today's communication standards (e.g., GSM). The Q-factor of a tuned circuit, such as a band-pass filter, is the ratio of its resonant frequency (or center frequency) to its 3 dB frequency bandwidth. SAW filters are generally not amenable to monolithic integration on a semiconductor substrate with the RF receiver. However, SAW filters remain conventional in RF receiver design because of the limited Q-factor of silicon-based inductors.

Although SAW filters can provide excellent attenuation of large out-of-band interferers and accurate pass-band location, they have several associated disadvantages. First, these filters have an approximate insertion loss of 1-2 dB in their passband. This directly adds to the noise factor and degrades sensitivity of the RF receiver. Second, these filters invariably add cost and circuit board area, especially in multi-band applications where several of these filters can be required. Third, these filters remove the flexibility of sharing LNAs in multi-band applications.

Therefore, there exists a need for an apparatus that provides adequate attenuation of large out-of-band interferers on a common semiconductor substrate, while allowing LNAs to be shared in multi-band applications.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. Frequency Translated Filter (FTF)

1.1 Overview

Figure 1:
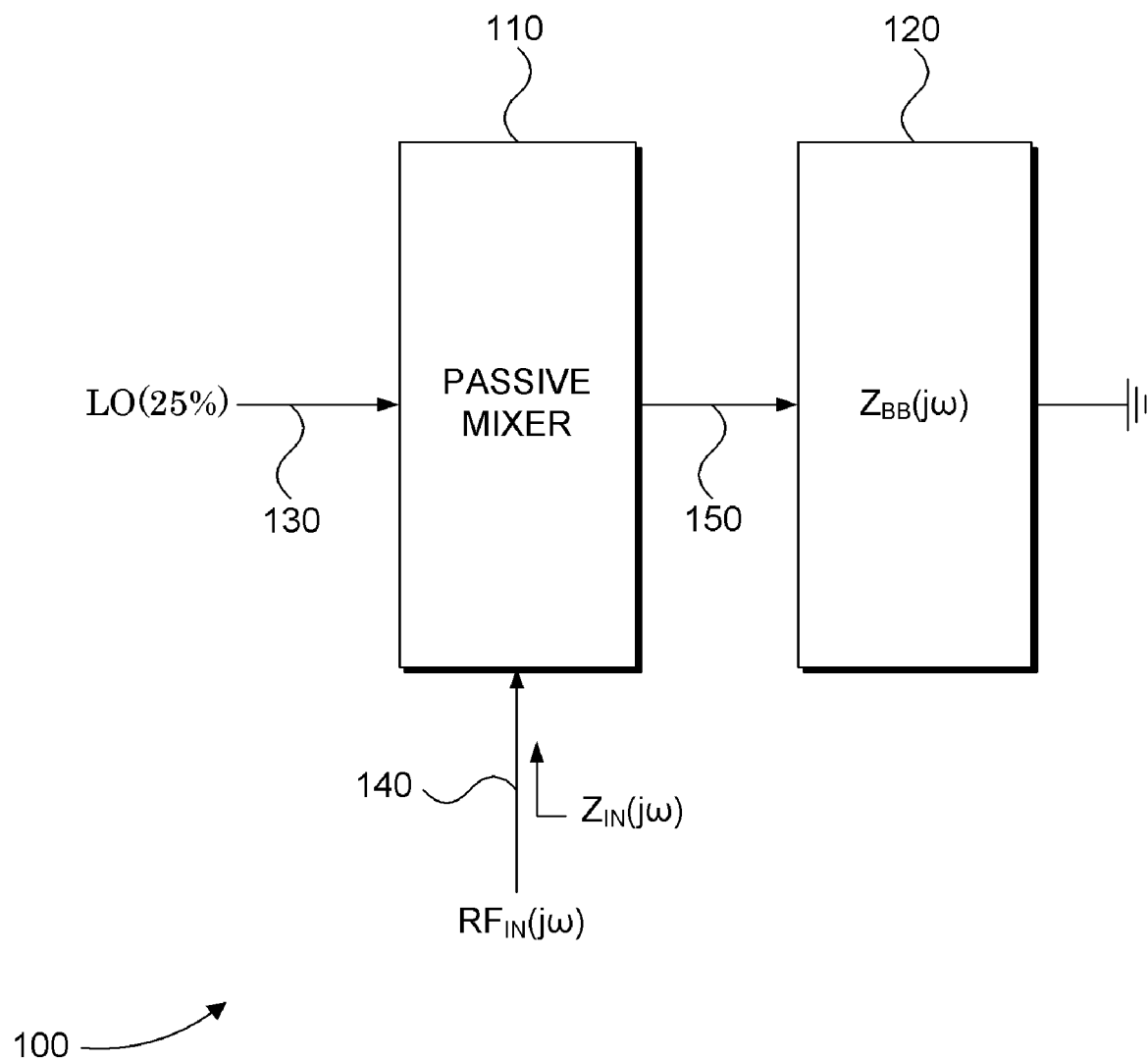
FIG. 1 illustrates a block diagram of a frequency translated filter (FTF), according to embodiments of the present invention.

FIG. 1 illustrates a block diagram of a frequency translated filter (FTF) 100, according to embodiments of the present invention. FTF 100 includes a passive mixer 110 and a baseband impedance ($Z_{BB}$) 120. Passive mixer 110 receives an LO signal at an input 130 and an RF input signal ($RF_{IN}$) at an input 140. Passive mixer 110 effectively multiplies the RF input signal by ±1 at a rate determined by the frequency of the LO signal ($\omega_{LO}$). This effective multiplication results in frequency conversion of the RF input signal by the sum ($\omega_{RF}+\omega_{LO}$) and difference ($\omega_{RF}-\omega_{LO}$ or $\omega_{LO}-\omega_{RF}$) in frequency between the LO signal and the RF input signal. The frequency converted RF input signal is coupled at an output 150 to baseband impedance 120.

Baseband impedance 120 includes a network of one or more resistors, capacitors, and inductors coupled between output 150 and ground. In general, baseband impedance 120 varies with the frequency of the signal applied across its terminals. Therefore, it follows that the frequency conversion of the RF input signal by passive mixer 110 alters the impedance seen by the RF input signal at input 140. Specifically, baseband impedance 120 will appear translated by $\pm\omega_{LO}$ at input 140.

For example, assuming baseband impedance 120 is a pure capacitance, its impedance is given by:

$$Z_{BB}(j\omega) = \frac{1}{j\omega C}$$

where j is the imaginary unit, $\omega$ is the frequency of the signal applied across the capacitor, and C is the capacitance. In the absence of passive mixer 110, the RF input signal would be applied directly across baseband impedance 120. Therefore, in this instance, the impedance seen at input 140 by the RF input signal is given by:

$$Z_{IN}(j\omega_{RF}) = \frac{1}{j\omega_{RF} C}$$

where $\omega_{RF}$ is the frequency of the RF input signal. In the presence of passive mixer 110, the RF input signal is frequency converted before application across baseband impedance 120 by $\pm\omega_{LO}$ Therefore, in the implementation of FTF 100, the impedance seen at input 140 by the RF input signal is given approximately by:

$$Z_{IN}(j\omega_{RF}) = \frac{1}{j(\omega_{RF} \pm \omega_{LO})C}$$

The above description reveals that baseband impedance 120 can be constructed to form a low-Q filter that appears as a high-Q filter to the RF input signal at input 140.

A filter is referred to as a high-Q filter if it selects or rejects a range of frequencies that is narrow in comparison to its resonant frequency (or center frequency). Specifically, the Q-factor of a tuned circuit, such as a band-pass or band-stop filter, is the ratio of its resonant frequency (or center frequency) to its 3 dB frequency bandwidth. Thus, if the baseband impedance forms a low-Q filter, the translation of the low-Q filter's center frequency, by an amount substantially larger than its 3 dB frequency bandwidth, results in a high-Q filter. The center frequency of the high-Q filter can be tuned by adjusting the frequency of the LO signal received at input 130.

In general, the impedance ($Z_{IN}$) seen at input 140 by the RF input signal can be designed to pass and block particular frequency bands (i.e., to filter particular frequency bands) of the RF input signal and can be constructed to form a band-stop, band-pass, high-pass, or low-pass filter. In other words, $Z_{IN}$ can be determined such that input 140 presents a high-impedance path to ground for frequency components of the RF input signal within a desired frequency band and a low-impedance path to ground for frequency components of the RF input signal outside the desired frequency band.

The high-impedance effectively precludes frequency components of the RF input signal, within the desired frequency band from being attenuated. Conversely, the low-impedance effectively allows frequency components of the RF input signal outside the desired frequency band to be attenuated. In other words, frequency components of the RF input signal outside the desired frequency band are filtered. The desired frequency band can be taken as an output at input 140, because the undesired frequency components have been shunted to ground.

1.2 Single-Ended Frequency Translated Filter (FTF)

Figure 2A:
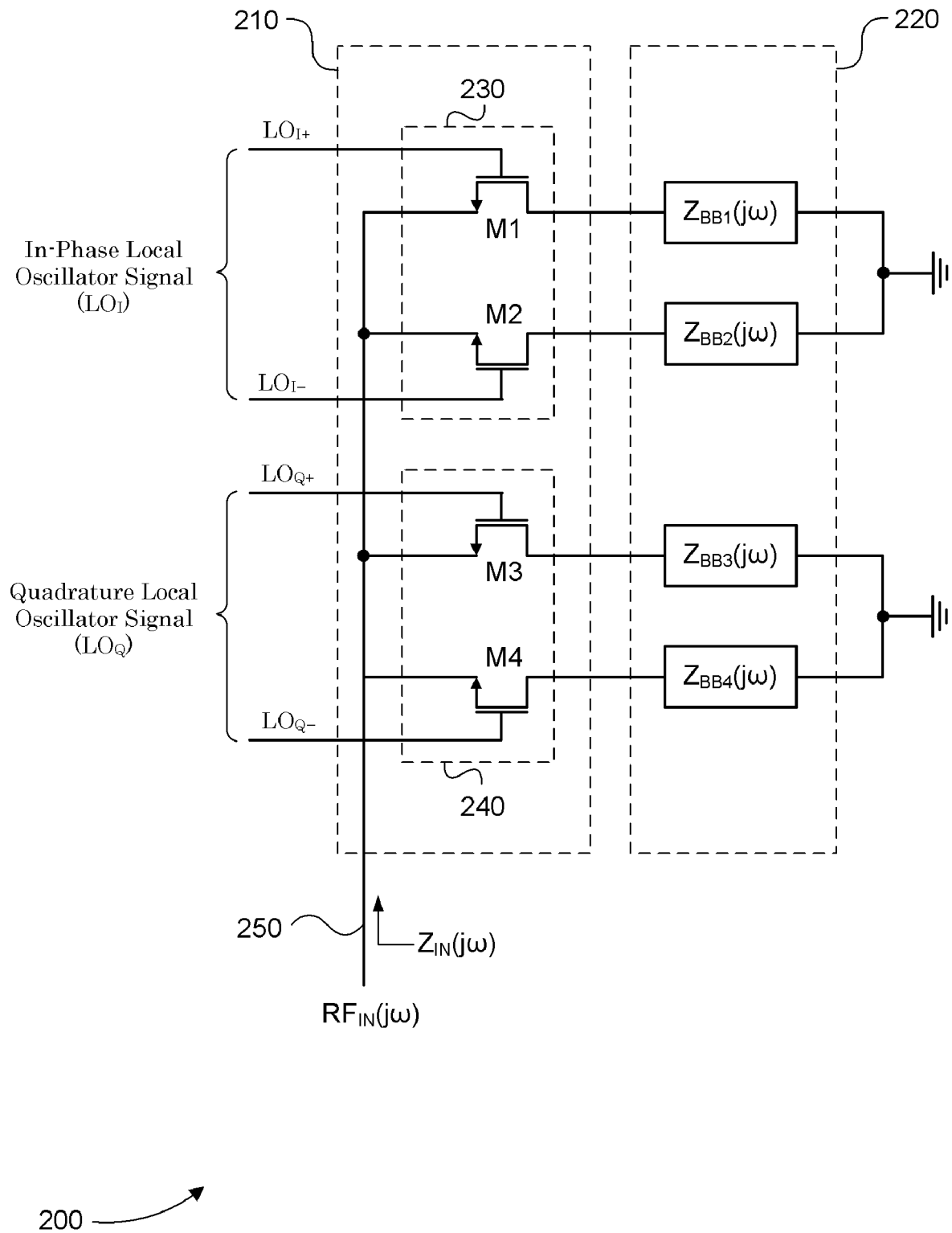
FIG. 2A illustrates a single-ended frequency translated filter (FTF), according to embodiments of the present invention.

FIG. 2A illustrates a single-ended frequency translated filter (FTF) 200, according to embodiments of the present invention. FTF 200 is single-ended in that it processes a single-ended RF input signal ($RF_{IN}$). FTF 200 includes a passive mixer 210 and a baseband impedance 220. Baseband impedance 220 includes a network of one or more passive components (e.g., resistors, inductors, and capacitors) that form a low-Q filter. Passive mixer 210 is configured to translate baseband impedance 220 to a higher frequency. The translated baseband impedance ($Z_{IN}$) forms a high-Q filter and is presented at single-ended input 250.

Passive mixer 210 includes single-balanced mixers 230 and 240. Single-balanced mixer 230 includes switching devices M1 and M2. Single-balanced mixer 240 includes switching devices M3 and M4. In an embodiment, switching devices M1, M2, M3, and M4 are metal-oxide semiconductor field effect transistors (MOSFETs). Specifically, switching devices M1, M2, M3, and M4 are n-channel MOSFETs (NMOS). However, as will be appreciated by one of ordinary skill in the art, switching devices M1, M2, M3, and M4 can be implemented using any suitable switching device, including bipolar junction transistors (BJTs) and junction gate field effect transistors (JFETs). In the embodiment of FIG. 2A, switches M1, M2, M3, and M4 are operated substantially in their linear mode when ON.

Single-balanced mixer 230 receives a differential in-phase LO signal ($LO_I$) that has a frequency of $\omega_{LO}$ and a duty-cycle substantially equal to 25%. The gate of switching device M1 is coupled to the positive in-phase LO signal ($LO_{I+}$), and the gate of switching device M2 is coupled to the negative in-phase LO signal ($LO_{I-}$). Because the two in-phase LO signals ($LO_{I+}$ and $LO_{I-}$) are substantially 180-degrees out of phase, switching devices M1 and M2 are switched ON and OFF at non-overlapping intervals at the frequency of the in-phase LO signal ($\omega_{LO}$). The non-overlapping switching of transistors M1 and M2 at a frequency of $\omega_{LO}$ effectively multiplies the RF input signal ($RF_{IN}$), coupled to the sources of switching devices M1 and M2, by ±1. This effective multiplication results in frequency conversion of the RF input signal by the sum ($\omega_{RF}+\omega_{LO}$) and difference ($\omega_{RF}-\omega_{LO}$ or $\omega_{LO}-\omega_{RF}$) in frequency between the in-phase LO signal ($LO_I$) and the RF input signal. The frequency-converted, in-phase component of the RF input signal is provided differentially to baseband impedance 220.

Single-balanced mixer 240 receives a differential quadrature LO signal ($LO_Q$) that has a frequency of $\omega_{LO}$ and a duty-cycle substantially equal to 25%. The quadrature LO signal ($LO_Q$) is substantially 90-degrees out of phase with the in-phase LO signal ($LO_I$). The gate of switching device M3 is coupled to the positive quadrature LO signal ($LO_{Q+}$), and the gate of switching device M4 is coupled to the negative quadrature LO signal ($LO_{Q-}$). Because the two quadrature LO signals ($LO_{Q+}$ and $LO_{Q-}$) are substantially 180-degrees out of phase, switching devices M3 and M4 are switched ON and OFF at non-overlapping intervals at the frequency of the quadrature LO signal ($\omega_{LO}$). The non-overlapping switching of transistors M3 and M4 at a frequency of $\omega_{LO}$ effectively multiplies the RF input signal ($RF_{IN}$), coupled to the sources of switching devices M3 and M4, by ±1. This effective multiplication results in frequency conversion of the RF input signal by the sum ($\omega_{RF}+\omega_{LO}$) and difference ($\omega_{RF}-\omega_{LO}$ or $\omega_{LO}-\omega_{RF}$) in frequency between the quadrature LO signal ($LO_Q$) and the RF input signal. The frequency-converted, quadrature component of the RF input signal is provided differentially to baseband impedance 220.

The use of single-balanced mixers 230 and 240, effectively removes any DC offset component of the in-phase and quadrature LO signals, respectively. Removal of the DC component helps to reduce undesired feed-through of the RF input signal at the output of single-balanced mixers 230 and 240.

The baseband impedance 220 includes baseband impedances $Z_{BB1}$, $Z_{BB2}$, $Z_{BB3}$, and $Z_{BB4}$. In an embodiment, each baseband impedance $Z_{BB1}$, $Z_{BB2}$, $Z_{BB3}$, and $Z_{BB4}$ is equivalent and includes a network of one or more resistors, capacitors, and inductors that form a low-Q filter. The baseband impedances $Z_{BB1}$, $Z_{BB2}$, $Z_{BB3}$, and $Z_{BB4}$ are respectively coupled between the drains of transistors M1, M2, M3, and M4 and ground. The baseband impedances $Z_{BB1}$, $Z_{BB2}$, $Z_{BB3}$, and $Z_{BB4}$ vary with the frequency of the signal applied across their terminals. Therefore, it follows that the frequency conversion of the RF input signal by passive mixer 210 alters the impedance seen by the RF input signal at the input 250. Specifically, the baseband impedances $Z_{BB1}$, $Z_{BB2}$, $Z_{BB3}$, and $Z_{BB4}$ will each appear translated by $\pm\omega_{LO}$ as seen by the RF input signal at input 250. Assuming $\omega_{LO}$ is at an RF frequency, the baseband impedances $Z_{BB1}$, $Z_{BB2}$, $Z_{BB3}$, and $Z_{BB4}$ seen by the RF input signal at input 250 will appear as an RF impedance.

It can be shown that the translated baseband impedance ($Z_{IN}$) is substantially given by:

$$Z_{IN}(j\omega_{RF}) = R_{SW} + \frac{2}{\pi^2}\{Z_{BB}(j\omega_{RF} - j\omega_{LO}) + Z_{BB}(j\omega_{RF} + j\omega_{LO})\}$$

where $\omega_{RF}$ is the frequency of the RF input signal at input 250, $\omega_{LO}$ is the frequency of the LO signal, and $R_{SW}$ is the switch resistance of transistors M1, M2, M3, and M4.

Figure 2B:
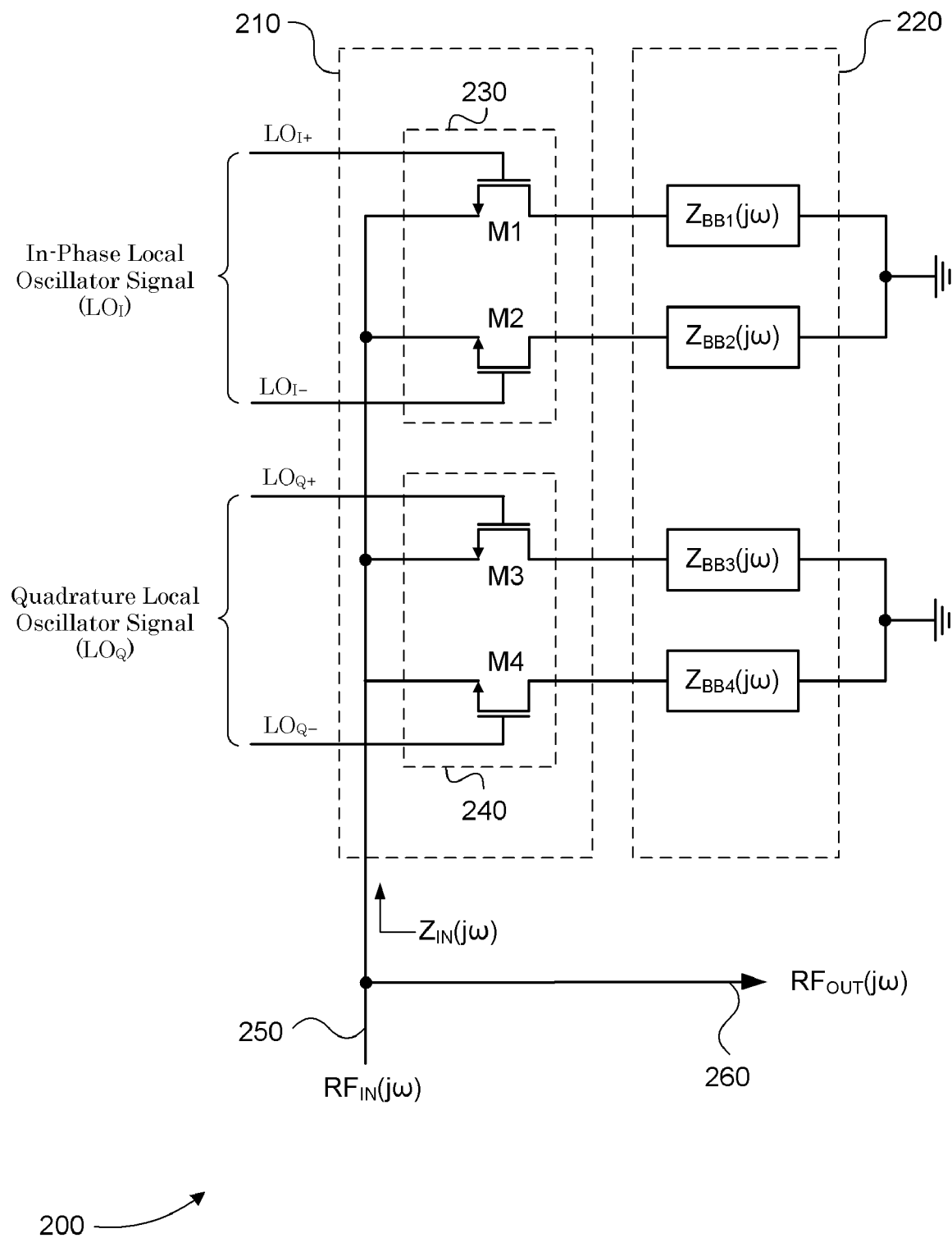
FIG. 2B illustrates a single-ended frequency translated filter (FTF), according to embodiments of the present invention.

In an embodiment, $Z_{IN}$ is determined such that input 250 presents a high-impedance path to ground for frequency components of the RF input signal within a desired frequency band and a low-impedance path to ground for frequency components of the RF input signal outside the desired frequency band. The high-impedance effectively precludes frequency components of the RF input signal, within the desired frequency band from being attenuated. Conversely, the low-impedance effectively allows frequency components of the RF input signal outside the desired frequency band to be attenuated. In other words, frequency components of the RF input signal outside the desired frequency band are filtered. The desired frequency band can be taken as an output at input 250, because the undesired frequency components have been shunted to ground. This is illustrated in FIG. 2B, where an explicit output 260 ($RF_{OUT}$) provides the desired frequency band.

It should be emphasized that FTF 200 can be fully integrated in CMOS IC technology (or others, e.g., Bipolar, BiCMOS, and SiGe) and applied in wireless receiver systems including GSM, Wideband Code Division Multiple Access (WCDMA), Bluetooth, and wireless LANs (e.g., IEEE 802.11), as will be explained further below.

Figure 3:
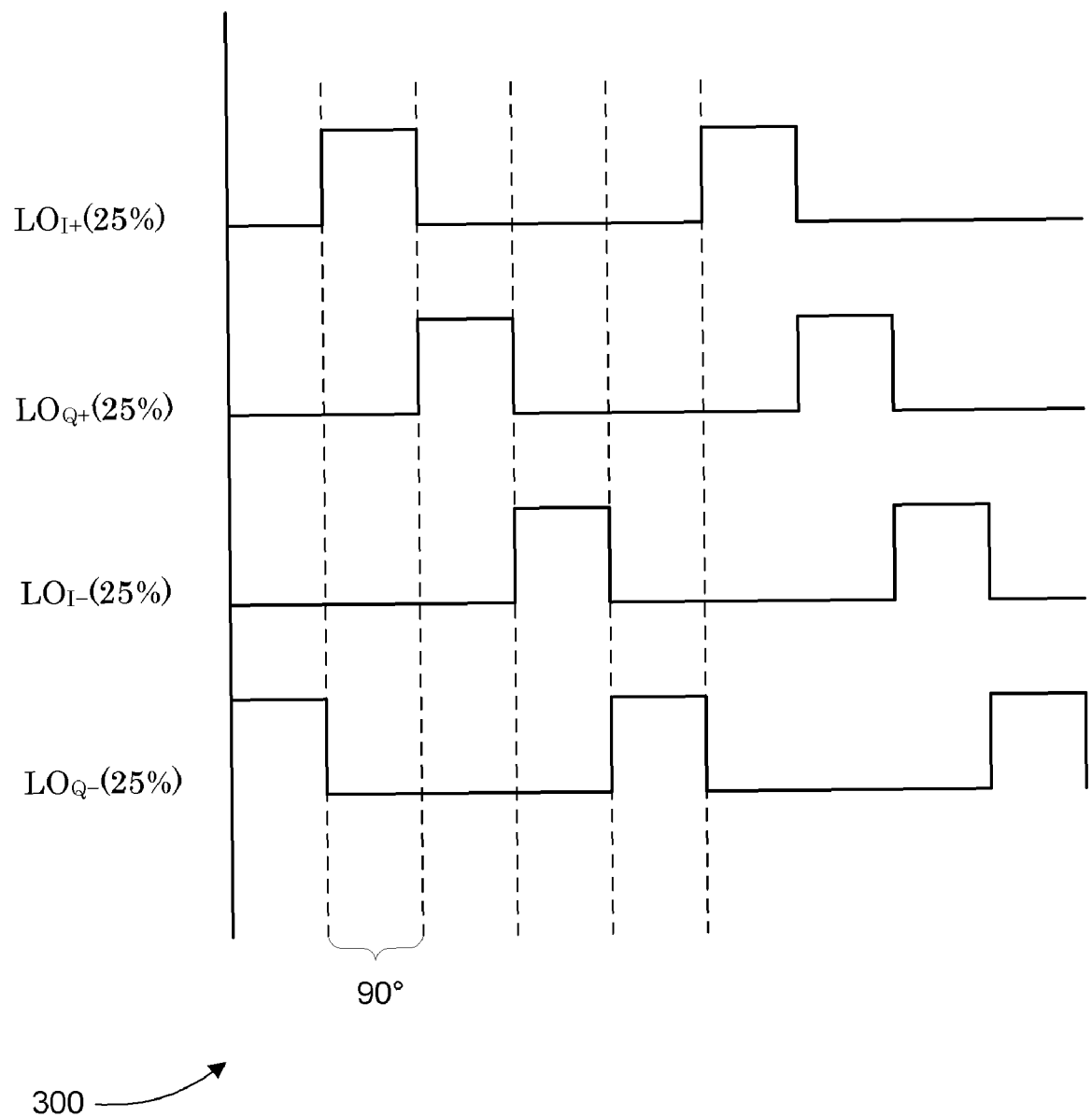
FIG. 3 illustrates a waveform diagram of exemplary LO signals for use by the passive mixer illustrated in FIG. 2A, according to embodiments of the present invention.

FIG. 3 illustrates a waveform diagram of exemplary LO signals 300 for use by passive mixer 210, according to embodiments of the present invention. LO signals 300 include two differential phases of an LO signal; namely, an in-phase LO signal ($LO_{I+}$ and $LO_{I-}$) and a quadrature LO signal ($LO_{Q+}$ and $LO_{Q-}$). The positive in-phase LO signal ($LO_{I+}$) has a phase shift of substantially 90-degrees relative to the positive quadrature LO signal ($LO_{Q+}$), and the negative in-phase LO signal ($LO_{I-}$) has a phase shift of substantially 90-degrees relative to the negative quadrature LO signal ($LO_{Q-}$). The positive and negative ends of the differential signals $LO_I$ and $LO_Q$ have a phase shift of substantially 180-degrees relative to each other.

LO signals 300 each have a duty cycle substantially equal to 25%. The 25% duty cycle of LO signals 300 helps to suppress undesired images of the RF input signal from occurring at the output of passive mixer 210. In general, the duty cycles of LO signals 300 can be greater than or less than 25%, provided that adequate image suppression is still achieved.

1.3 Single-Ended Frequency Translated Notch Filter (FTNF)

Figure 4:
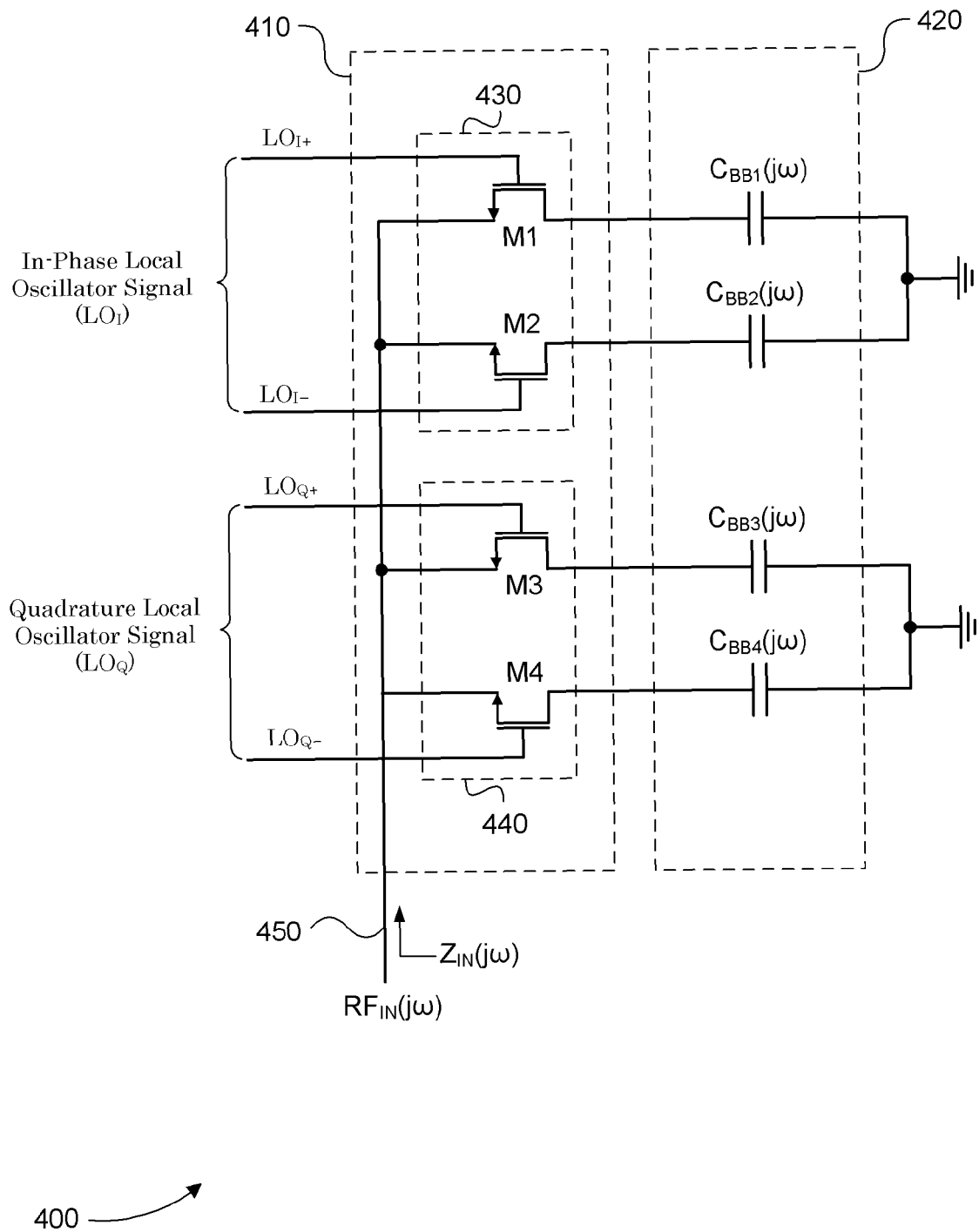
FIG. 4 illustrates a single-ended frequency translated notch filter (FTNF), according to embodiments of the present invention.

FIG. 4 illustrates a single-ended frequency translated notch filter (FTNF) 400, according to embodiments of the present invention. FTNF 400 is single-ended in that it processes a single-ended RF input signal ($RF_{IN}$). FTNF 400 includes a passive mixer 410 and a baseband impedance 420. In general, FTNF 400 includes substantially the same structure as FTF 200 illustrated in FIG. 2A. However, the generic baseband impedances $Z_{BB1}$, $Z_{BB2}$, $Z_{BB3}$, and $Z_{BB4}$ have been replaced by capacitors $C_{BB1}$, $C_{BB2}$, $C_{BB3}$, and $C_{BB4}$, respectively. In an embodiment, the capacitors $C_{BB1}$, $C_{BB2}$, $C_{BB3}$, and $C_{BB4}$ are each substantially equivalent.

The impedance of capacitors $C_{BB1}$, $C_{BB2}$, $C_{BB3}$, and $C_{BB4}$ is (ignoring parasitics) given by:

$$C_{BB}(j\omega) = \frac{1}{j\omega C}$$

where j is the imaginary unit, ω is the frequency of the signal applied across the capacitor, and C is the capacitance. As is readily apparent from the above, for DC signals, $C_{BB}$ presents an extremely large impedance. However, as the frequency of the applied signal moves in either the positive or negative direction, away from DC (i.e., 0-MHz), the impedance $C_{BB}$ decreases. Thus, capacitors $C_{BB1}$, $C_{BB2}$, $C_{BB3}$, and $C_{BB4}$, effectively form a low-Q band-stop filter centered at baseband.

As noted above in regard to FIG. 2A, passive mixer 410 is configured to translate baseband impedance 420 to a higher frequency. Baseband impedance 420 is substantially translated by the frequency of the LO signal ($\omega_{LO}$) received by passive mixer 410; that is, the low-Q band-stop filter formed by baseband impedance 420, is substantially translated by $\pm\omega_{LO}$ and becomes a high-Q band stop filter. A high-Q band-stop filter is commonly referred to as a notch filter. The translated baseband impedance ($Z_{IN}$) that forms the high-Q band-stop filter (i.e., the notch filter) is presented at single-ended input 450.

It can be shown that the translated baseband impedance ($Z_{IN}$) is substantially given by:

$$Z_{IN}(j\omega_{RF}) = R_{SW} + \frac{4}{\pi^2} \frac{j\omega_{RF}}{C_{BB}\{(j\omega_{RF})^2 + \omega_{LO}^2\}}$$

where $\omega_{RF}$ is the frequency of the RF input signal at input 450, $\omega_{LO}$ is the frequency of the LO signal, and $R_{SW}$ is the switch resistance of transistors M1, M2, M3, and M4.

In an embodiment, $Z_{IN}$ is determined such that input 450 presents a high-impedance path to ground for frequency components of the RF input signal within a desired frequency band and a low-impedance path to ground for frequency components of the RF input signal outside the desired frequency band. The high-impedance (i.e., the notch) effectively precludes frequency components of the RF input signal, within the desired frequency band from being attenuated. Conversely, the low-impedance effectively allows frequency components of the RF input signal outside the desired frequency band to be attenuated. In other words, frequency components of the RF input signal outside the desired frequency band are filtered. The desired frequency band can be taken as an output at input 450, because the undesired frequency components have been shunted to ground.

Low-Q capacitive impedances, such as $C_{BB1}$, $C_{BB2}$, $C_{BB3}$, and $C_{BB4}$, are readily capable of monolithic integration on a common semiconductor substrate together with passive mixer 410. Therefore, FTNF 400 provides a suitable notch filter implementation for integration on a semiconductor substrate. Moreover, because FTNF 400 utilizes a passive mixer 410 and baseband impedance 420, formed from passive components, power-consumption of FTNF filter 400 can be fairly low, depending mainly on the generation of the differential, in-phase and quadrature LO signals ($LO_I$ and $LO_Q$).

It should be emphasized that FTNF 400 can be fully integrated in CMOS IC technology (or others, e.g., Bipolar, BiCMOS, and SiGe) and applied in wireless receiver systems including GSM, WCDMA, Bluetooth, and wireless LANs (e.g., IEEE 802.11), as will be explained further below.

Figure 5:
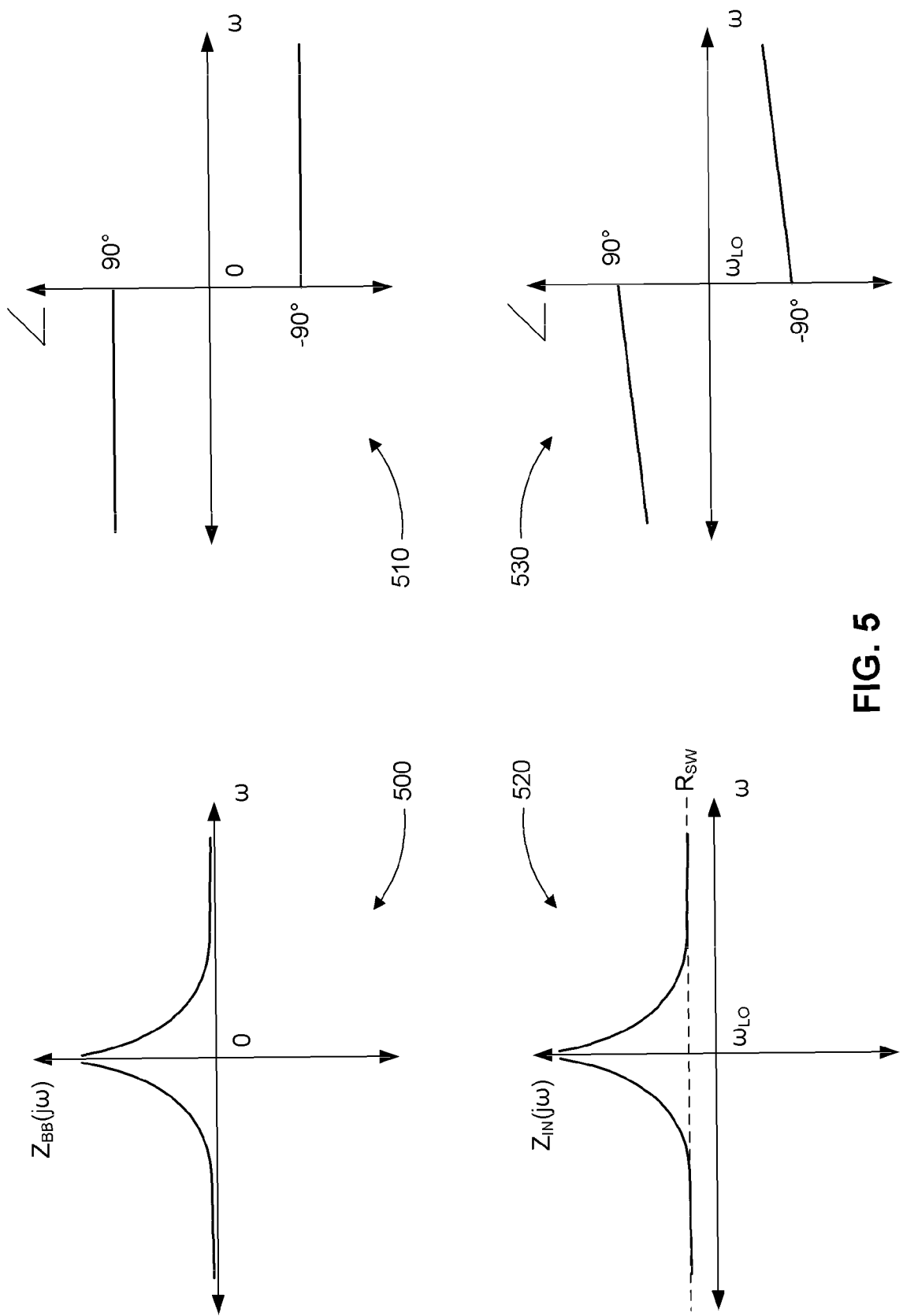
FIG. 5 illustrates the magnitude and phase relationship of the baseband impedance ($C_{BB}$) and the translated baseband impedance ($Z_{IN}$) illustrated in FIG. 4, according to embodiments of the present invention.

FIG. 5 illustrates the magnitude and phase relationship of baseband impedance 420 ($Z_{BB}$) and the translated baseband impedance ($Z_{IN}$), according to embodiments of the present invention. Baseband impedance 420 ($Z_{BB}$) has a frequency versus magnitude response 500 and a frequency versus phase response 510. For DC signals, $Z_{BB}$ presents an extremely large impedance. However, as the frequency of the applied signal moves in either the positive or negative direction, away from DC (i.e., 0-MHz), the impedance $Z_{BB}$ decreases. Thus, $Z_{BB}$ effectively forms a low-Q band-stop filter centered at baseband.

Frequency translated baseband impedance ($Z_{IN}$) has a frequency versus magnitude response 520 and a frequency versus phase response 530. The frequency versus magnitude response 530 clearly illustrates that the baseband impedance 420 ($Z_{BB}$) has been substantially translated by $\omega_{LO}$ (only positive frequencies are illustrated in 520). For an applied signal at or near $\omega_{LO}$, $Z_{IN}$ presents an extremely large impedance. However, as the frequency of the applied signal moves in either the positive or negative direction, away from $\omega_{LO}$, the impedance $Z_{IN}$ quickly decreases to substantially the switch resistance $R_{SW}$ of switching devices M1, M2, M3, and M4. Thus, $Z_{IN}$ effectively forms a high-Q band-stop filter (i.e., a notch filter) centered at $\omega_{LO}$.

1.4 Differential Frequency Translated Filter (FTF)

Figure 6:
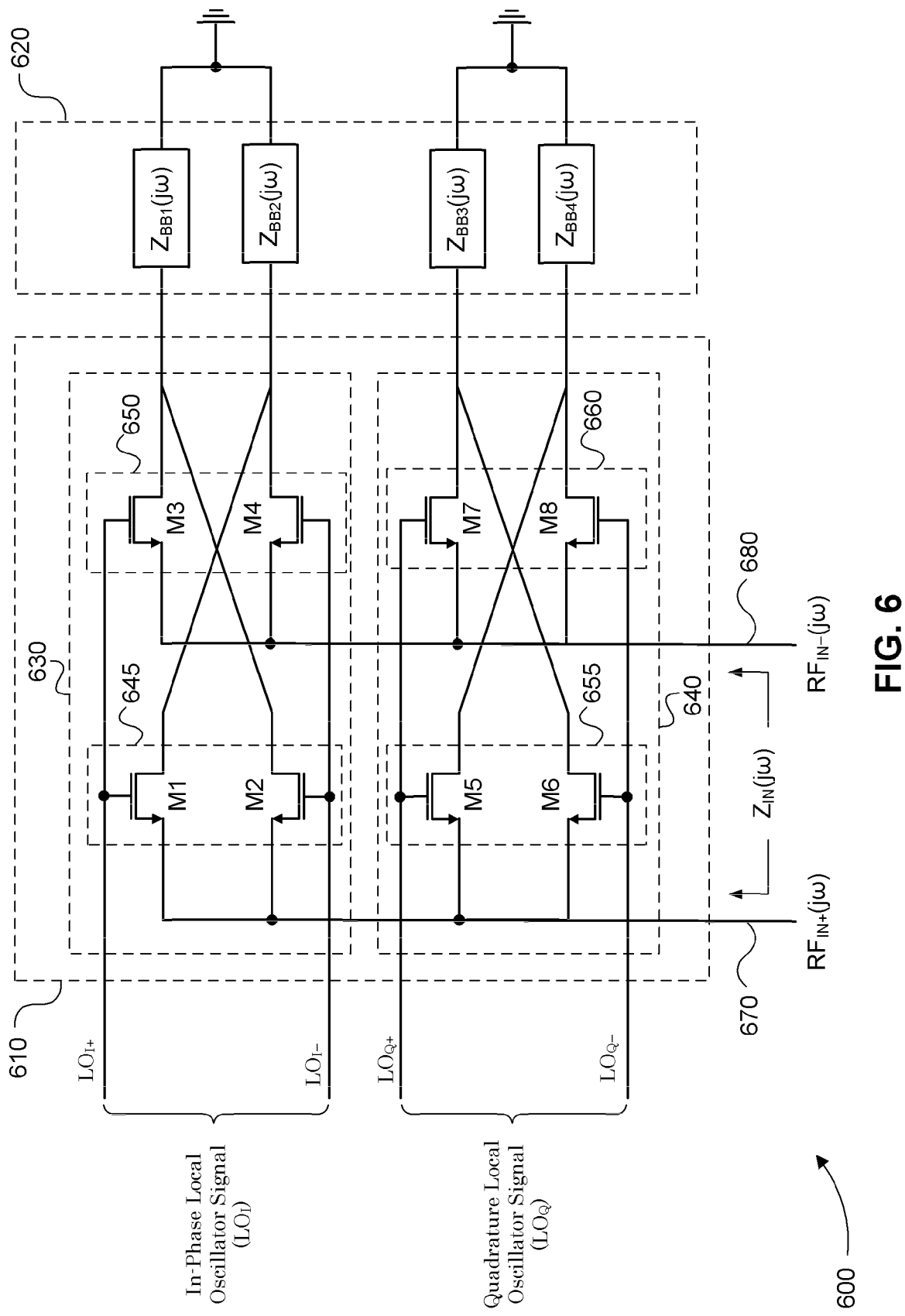
FIG. 6 illustrates a differential frequency translated filter (FTF), according to embodiments of the present invention.

FIG. 6 illustrates a differential frequency translated filter (FTF) 600, according to embodiments of the present invention. FTF 600 is differential in that it processes a differential RF input signal ($RF_{IN+}$ and $RF_{IN-}$). FTF 600 includes a passive mixer 610 and a baseband impedance 620. Baseband impedance 620 includes a network of one or more passive components (e.g., resistors, inductors, and capacitors) that form a low-Q filter. Passive mixer 610 is configured to translate baseband impedance 620 to a higher frequency. The translated baseband impedance ($Z_{IN}$) forms a high-Q filter and is presented at differential input pair 670 and 680.

Passive mixer 610 includes a double-balanced mixer 630 and a double-balanced mixer 640. Double-balanced mixer 630 includes switching devices M1, M2, M3, and M4. Double-balanced mixer 640 includes switching devices M5, M6, M7, and M8. In an embodiment, switching devices M1-M8 are metal-oxide semiconductor field effect transistors (MOSFETs). Specifically, switching devices M1-M8 are n-channel MOSFETs (NMOS). However, as will be appreciated by one of ordinary skill in the art, switching devices M1-M8 can be implemented using any suitable switching device, including bipolar junction transistors (BJTs) and junction gate field effect transistors (JFETs). In the embodiment of FIG. 6, switches M1-M8 are operated substantially in their linear mode when ON.

Double-balanced mixer 630 receives a differential, in-phase LO signal ($LO_I$) that has a frequency of $\omega_{LO}$ and a duty-cycle substantially equal to 25%. Double-balanced mixer 630 is essentially formed from two single-balanced mixers 645 and 650. The gates of switching devices M1 and M3 are coupled to the positive in-phase LO signal ($LO_{I+}$), and the gates of switching devices M3 and M4 are coupled to the negative in-phase LO signal ($LO_{I-}$). Because the two in-phase LO signals ($LO_{I+}$ and $LO_{I-}$) are substantially 180-degrees out of phase, switching device pair M1 and M2 and switching device pair M3 and M4 are switched ON and OFF at non-overlapping intervals at the frequency of the in-phase LO signal ($\omega_{LO}$). The non-overlapping switching at a frequency of $\omega_{LO}$ effectively multiplies the positive RF input signal ($RF_{IN+}$), coupled to the sources of switching devices M1 and M2, and the negative RF input signal ($RF_{IN-}$), coupled to the sources of switching devices M3 and M4, by ±1. This effective multiplication results in frequency conversion of the differential RF input signal by the sum ($\omega_{RF}+\omega_{LO}$) and difference ($\omega_{RF}-\omega_{LO}$ or $\omega_{LO}-\omega_{RF}$) in frequency between the in-phase LO signal ($LO_I$) and the differential RF input signal. The frequency-converted in-phase component of the RF input signal is provided differentially to baseband impedance 620.

Double-balanced mixer 640 receives a differential, quadrature LO signal ($LO_Q$) that has a frequency of $\omega_{LO}$ and a duty-cycle substantially equal to 25%. Double-balanced mixer 640 is essentially formed from two single-balanced mixers 655 and 660. The gates of switching devices M5 and M7 are coupled to the positive quadrature LO signal ($LO_{Q+}$), and the gates of switching devices M6 and M8 are coupled to the negative quadrature LO signal ($LO_{Q-}$). Because the two quadrature LO signals ($LO_{Q+}$ and $LO_{Q-}$) are substantially 180-degrees out of phase, switching device pair M5 and M6 and switching device pair M7 and M8 are switched ON and OFF at non-overlapping intervals at the frequency of the quadrature LO signal ($\omega_{LO}$). The non-overlapping switching at a frequency of $\omega_{LO}$ effectively multiplies the positive RF input signal ($RF_{IN+}$), coupled to the sources of switching devices M5 and M6, and the negative RF input signal ($RF_{IN-}$), coupled to the sources of switching devices M7 and M8, by ±1. This effective multiplication results in frequency conversion of the differential RF input signal by the sum ($\omega_{RF}+\omega_{LO}$) and difference ($\omega_{RF}-\omega_{LO}$ or $\omega_{LO}-\omega_{RF}$) in frequency between the in-phase LO signal ($LO_I$) and the differential RF input signal. The frequency-converted quadrature component of the RF input signal is provided differentially to baseband impedance 620.

The use of double-balanced mixers 630 and 640 effectively removes any DC offset component of the in-phase and quadrature LO signals, as well as any DC offset component of the differential RF input signal. Removal of the DC components helps to reduce undesired feed-through of the RF input signal and the LO signal at the output of double-balanced mixers 630 and 640.

The baseband impedance 620 includes baseband impedances $Z_{BB1}$, $Z_{BB2}$, $Z_{BB3}$, and $Z_{BB4}$. In an embodiment, each baseband impedance $Z_{BB1}$, $Z_{BB2}$, $Z_{BB3}$, and $Z_{BB4}$ is equivalent and includes a network of one or more resistors, capacitors, and inductors that form a low-Q filter. The baseband impedances $Z_{BB1}$, $Z_{BB2}$, $Z_{BB3}$, and $Z_{BB4}$ are respectively coupled between the drains of transistors M1-M8 and ground. The baseband impedances $Z_{BB1}$, $Z_{BB2}$, $Z_{BB3}$, and $Z_{BB4}$ vary with the frequency of the signal applied across their terminals. Therefore, it follows that the frequency conversion of the RF input signal by passive mixer 610 alters the impedance seen by the RF input signal at differential input pair 670 and 680. Specifically, the baseband impedances $Z_{BB1}$, $Z_{BB2}$, $Z_{BB3}$, and $Z_{BB4}$ will each appear translated by $\pm\omega_{LO}$ as seen by the RF input signal at differential input pair 670 and 680. Assuming $\omega_{LO}$ is at an RF frequency, the baseband impedances $Z_{BB1}$, $Z_{BB2}$, $Z_{BB3}$, and $Z_{BB4}$ seen by the RF input signal at differential input pair 670 and 680 will appear as an RF impedance.

In an embodiment, $Z_{IN}$ is determined such that differential input pair 670 and 680 presents a high-impedance path to ground for frequency components of the RF input signal within a desired frequency band and a low-impedance path to ground for frequency components of the RF input signal outside the desired frequency band. The high-impedance effectively precludes frequency components of the RF input signal, within the desired frequency band from being attenuated. Conversely, the low-impedance effectively allows frequency components of the RF input signal outside the desired frequency band to be attenuated. In other words, frequency components of the RF input signal outside the desired frequency band are filtered. The desired frequency band can be taken as a differential output at differential input pair 670 and 680, because the undesired frequency components have been shunted to ground.

The baseband impedances $Z_{BB1}$, $Z_{BB2}$, $Z_{BB3}$, and $Z_{BB4}$ can be replaced by any network of passive components (e.g., resistors, capacitors, and inductors) to provide a high-Q filter at differential input pair 670 and 680. For example, by replacing the baseband impedances $Z_{BB1}$, $Z_{BB2}$, $Z_{BB3}$, and $Z_{BB4}$ with capacitors $C_{BB1}$, $C_{BB2}$, $C_{BB3}$, and $C_{BB4}$ a differential frequency translated notch filter (FTNF) can be created.

It should be emphasized that FTF 600 can be fully integrated in CMOS IC technology (or others, e.g., Bipolar, BiCMOS, and SiGe) and applied in wireless receiver systems including GSM, WCDMA, Bluetooth, and wireless LANs (IEEE 802.11), as will be explained further below.

2. Exemplary Operating Environment

Figure 7:
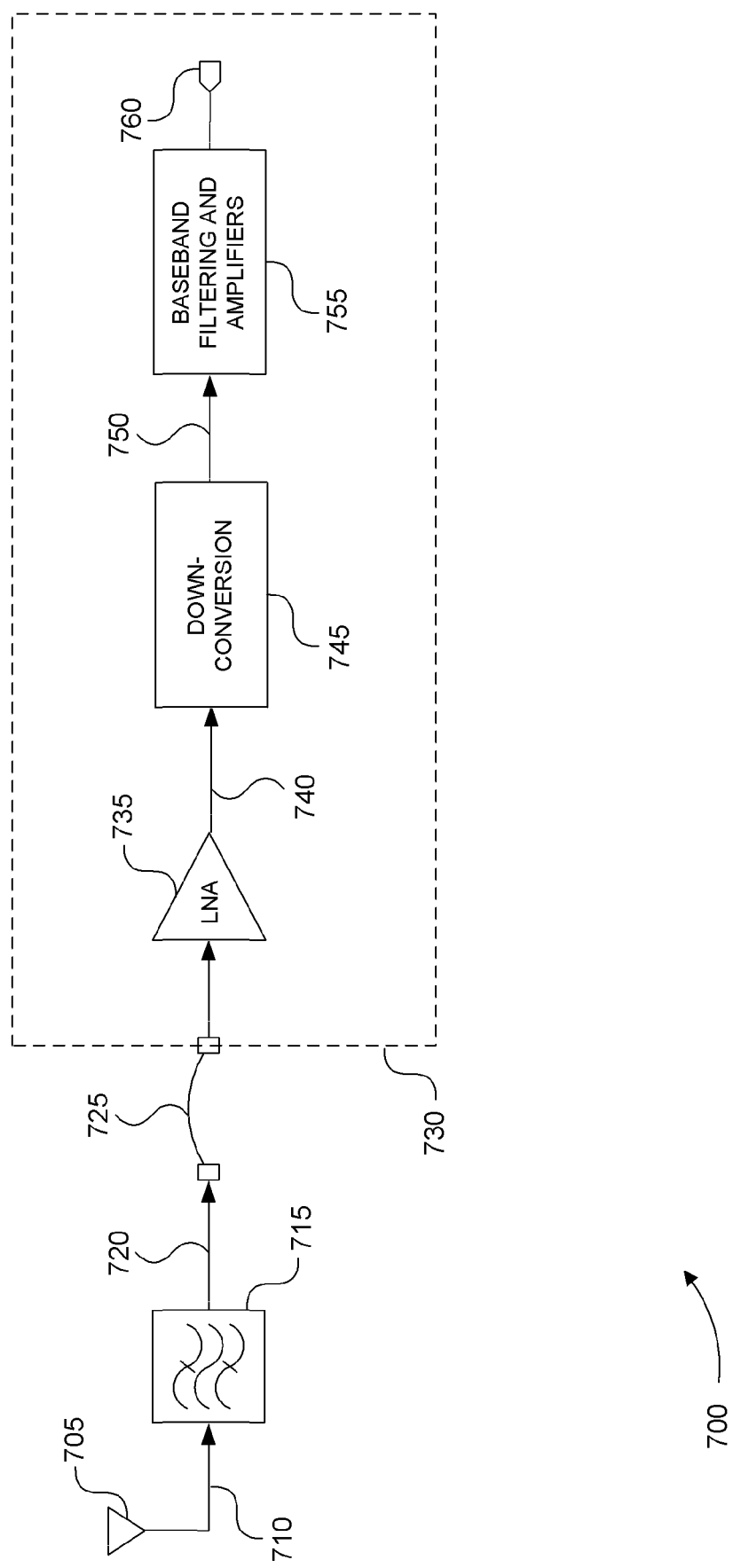
FIG. 7 illustrates an exemplary RF receiver that provides conventional suppression of out-of-band interferers, according to embodiments of the present invention.

FIG. 7 illustrates an exemplary RF receiver 700 that provides conventional suppression of out-of-band interferers. RF receiver 700 receives at an antenna 705 an RF signal 710 that includes a desired channel. In an embodiment, the desired channel is positioned within a frequency band defined by a particular communications standard. For example, the desired channel can be positioned within a frequency band defined by the GSM standard, such as the Global System for Mobile Communications 900 (GSM-900) band, the Digital Cellular System 1800 (DCS-1800) band, or the Personal Communications Services 1900 (PCS-1900) band.

Before undergoing substantive processing by RF receiver 700, RF signal 710 is provided to an RF filter 715 to attenuate out-of-band interferers. Specifically, RF filter 715 provides a band-pass response substantially centered in the particular frequency band containing the desired channel.

In general, today's high frequency communication standards, coupled with the relative proximity and strength of out-of-band interferers, have prompted the need for high-Q RF filters, such as RF filter 715. The limited Q of silicon-based inductors has thus far prevented the practical integration of RF filter 715 on a semiconductor substrate with the other components of RF receiver 700. Therefore, the conventional approach is an off-chip solution, typically in the form of a mechanically-resonant device, such as a surface acoustic wave (SAW) filter.

After being processed by RF filter 715, filtered RF signal 720 is provided by a bond wire 725 to subsequent stages of RF receiver 700.

Specifically, bond wire 725 provides filtered RF signal 720 at an input to a semiconductor substrate 730. A low noise amplifier (LNA) 735 receives filtered RF signal 720 and provides sufficient amplification to the desired channel to overcome the noise of subsequent stages. In general, RF filter 715 attenuates out-of-band interferers within RF signal 710 to prevent gain compression of LNA 735. A reduction in the gain of LNA 735 can degrade the sensitivity of RF receiver 700.

After the initial out-of-band filtering and low noise amplification, an amplified RF signal 740 enters the receiver's frequency conversion stage 745. This stage down-converts the desired channel to one or more known frequencies. Frequency conversion stage 745 can implement any suitable down-conversion architecture (e.g., a homodyne architecture or a heterodyne architecture).

A down-converted signal 750 is provided to a baseband filtering and amplifiers stage 755 to provide final gain adjustment and suppression of interferers that exist outside of the desired channel's bandwidth. The desired channel is subsequently provided at an output terminal 760 for further baseband processing.

Figure 8:
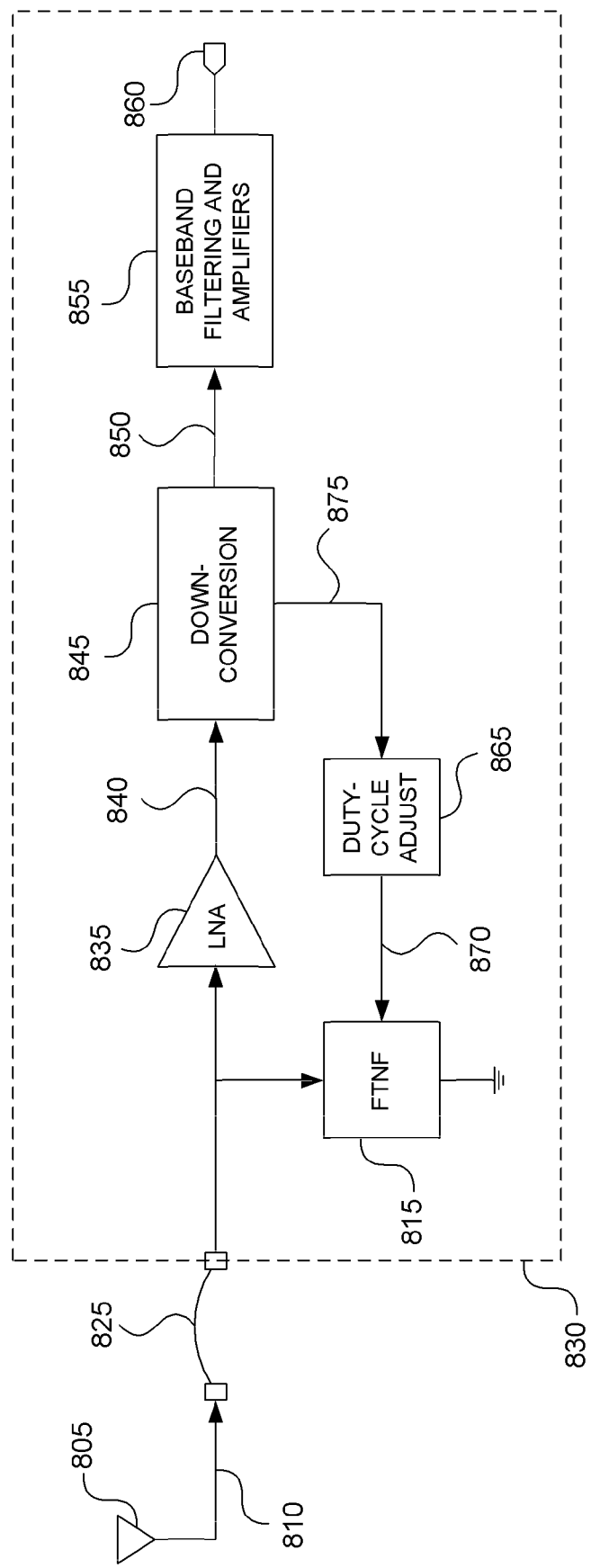
FIG. 8 illustrates an exemplary RF receiver that provides for suppression of out-of-band interferers on a semiconductor substrate, according to embodiments of the present invention.

FIG. 8 illustrates an exemplary RF receiver 800 that provides for suppression of out-of-band interferers on a semiconductor substrate, according to embodiments of the present invention. In general, RF receiver 800 includes substantially the same structure as RF receiver 700 illustrated in FIG. 7. However, RF filter 715 has been replaced by a frequency translated notch filter (FTNF) 815 integrated on semiconductor substrate 830. In an embodiment, FTNF 815 takes the form of FTNF 400 described above in FIG. 4. However, it should be noted that FTNF 815 can be readily implemented as a differential FTNF as is apparent from the above description of differential FTF 600 in FIG. 6. The elimination of discrete RF filter 715 can reduce overall cost and circuit board area required by RF receiver 800.

In reference to FIG. 8, RF receiver 800 receives at an antenna 805 an RF signal 810 that includes a desired channel. In an embodiment, the desired channel is positioned within a frequency band defined by a particular communications standard. For example, the desired channel can be positioned within a frequency band defined by the GSM standard, such as the Global System for Mobile Communications 900 (GSM-900) band, the Digital Cellular System 1800 (DCS-1800) band, or the Personal Communications Services 1900 (PCS-1900) band.

Before undergoing substantive processing by RF receiver 800, RF signal 810 is provided to FTNF 815 to attenuate out-of-band interferers. FTNF 815 includes a passive mixer (not shown) and a baseband impedance that forms a low-Q band-stop filter (not shown). The passive mixer is configured to translate the baseband impedance to a higher frequency by an amount substantially equal to the frequency of a 25% duty cycle LO signal 870. The translated impedance forms a high-Q notch filter coupled between RF signal 810 and ground.

FTNF 815 can be tuned to (i.e., centered within) either the frequency band that contains the desired channel or to the desired channel itself. Specifically, 25% duty cycle LO signal 870 can be adjusted to have a frequency substantially equal to either the center frequency of the band containing the desired channel or to the center frequency of the desired channel itself. Moreover, the bandwidth of the notch presented by FTNF 815 can be designed to encompass either the band containing the desired channel or the desired channel itself. In this way, FTNF 815 can present, at the input coupled to the RF signal 810, a high-impedance path to ground for either the entire frequency band containing the desired channel or to the desired channel itself, and a low impedance path to ground for out-of-band interferers.

Since out-of-band interferers will not develop any substantial voltage across the impedance provided by FTNF 815, they will be attenuated. Signals outside the pass-bands of FTNF 815, however, will develop a substantial voltage across the impedance provided by FTNF 815 and, thus, will be provided to LNA 835 for further processing. Low noise amplifier (LNA) 835 provides sufficient amplification to the desired channel to overcome the noise of subsequent stages.

After low noise amplification, an amplified RF signal 840 enters the receiver's frequency conversion stage 845. This stage down-converts the desired channel to one or more known frequencies. Frequency conversion stage 845 can implement any suitable down-conversion architecture (e.g., a homodyne architecture or a heterodyne architecture).

In an embodiment, the frequency conversion stage 845 implements a homodyne architecture, where the desired channel is converted directly to baseband. Homodyne architectures typically utilize an image reject mixer that can include two double-balanced mixers. Each mixer receives one quadrature phase of a 50% duty cycle LO signal having a frequency substantially centered within the desired channel. The image reject mixer down-converts the desired channel to baseband, while substantially suppressing the well known image response present in the mixer's output. In an embodiment, FTNF 815 utilizes the quadrature phases of the 50% duty cycle LO signal used within down-conversion stage 845. Specifically, the quadrature phases of the 50% duty cycle LO signal are coupled to a duty-cycle adjust module 865 via connection 875. Duty-cycle adjust module converts the 50% duty cycle LO signal received via connection 875, into an LO signal having a duty cycle substantially equal to 25% that can be used to tune FTNF 815 as noted above.

After frequency conversion, a down-converted signal 850 is provided to a baseband filtering and amplifiers stage 855 to provide final gain adjustment and suppression of interferers that exist outside of the desired channel's bandwidth. The desired channel is subsequently provided at an output terminal 860 for further baseband processing.

It should be noted that FIG. 8 illustrates one exemplary operating environment for FTNF 815. As will be apparent to one of ordinary skill in the art, FTNF 815 can be used within any application to achieve a high-Q notch filter. These other applications are within the scope and spirit of the present invention.

Figure 9:
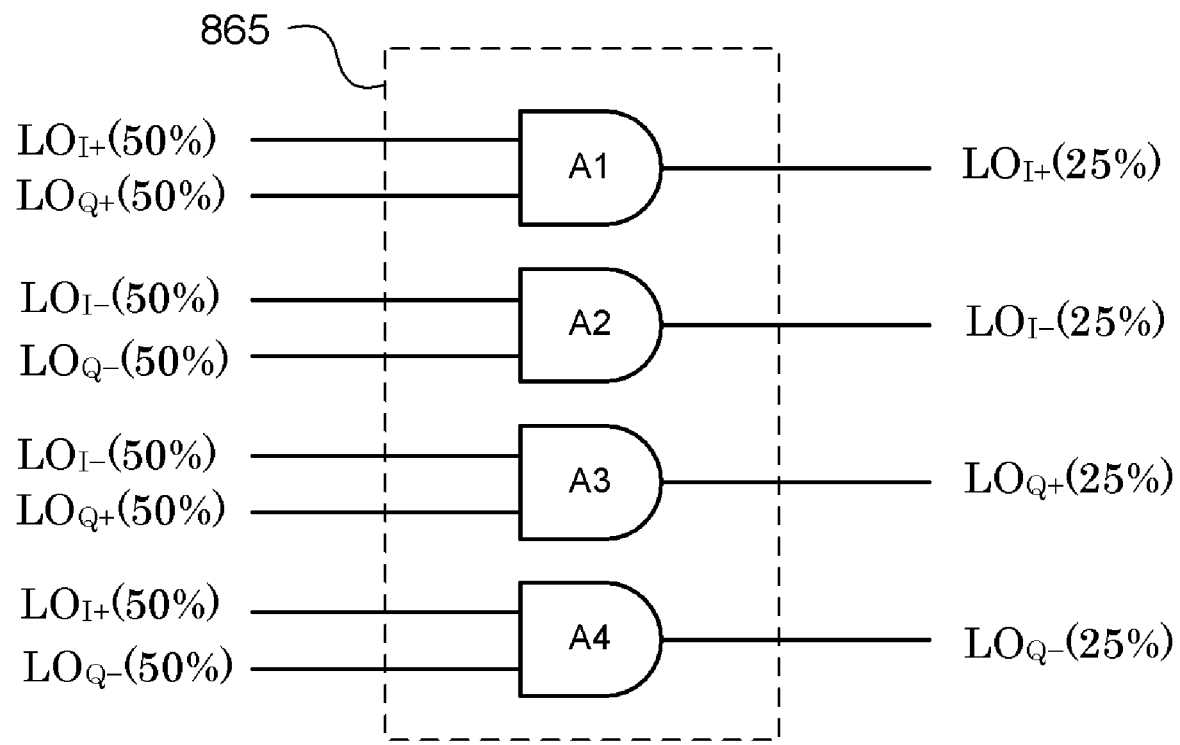
FIG. 9 illustrates an exemplary implementation of a duty-cycle adjust module, according to embodiments of the present invention.

FIG. 9 illustrates an exemplary implementation of duty-cycle adjust module 865 presented in FIG. 8, according to embodiments of the present invention. As illustrated by FIG. 9, duty-cycle adjust module 865 can create the quadrature phases of a 25% duty-cycle LO signal using the quadrature phases of a 50% duty-cycle LO signal. Specifically, duty-cycle adjust module 865 uses four AND gates (A1-A4), each of which processes two 50% duty-cycle LO signals to produce one 25% duty-cycle LO signal. The logical operation performed by each AND gate (A1-A4) and the resulting logical outputs are as follows:

$$LO_{I-}(50\%) \cdot LO_{Q+}(50\%) = LO_{I-}(25\%) \quad (A1)$$

$$LO_{I-}(50\%) \cdot LO_{Q-}(50\%) = LO_{I+}(25\%) \quad (A2)$$

$$LO_{I-}(50\%) \cdot LO_{Q+}(50\%) = LO_{Q-}(25\%) \quad (A3)$$

$$LO_{I+}(50\%) \cdot LO_{Q-}(50\%) = LO_{Q-}(25\%) \quad (A4)$$

The following description below describes FIGS. 10-13 and provides further embodiments and implementations of FTNFs for suppression of out-of-band interferers.

Figure 10:
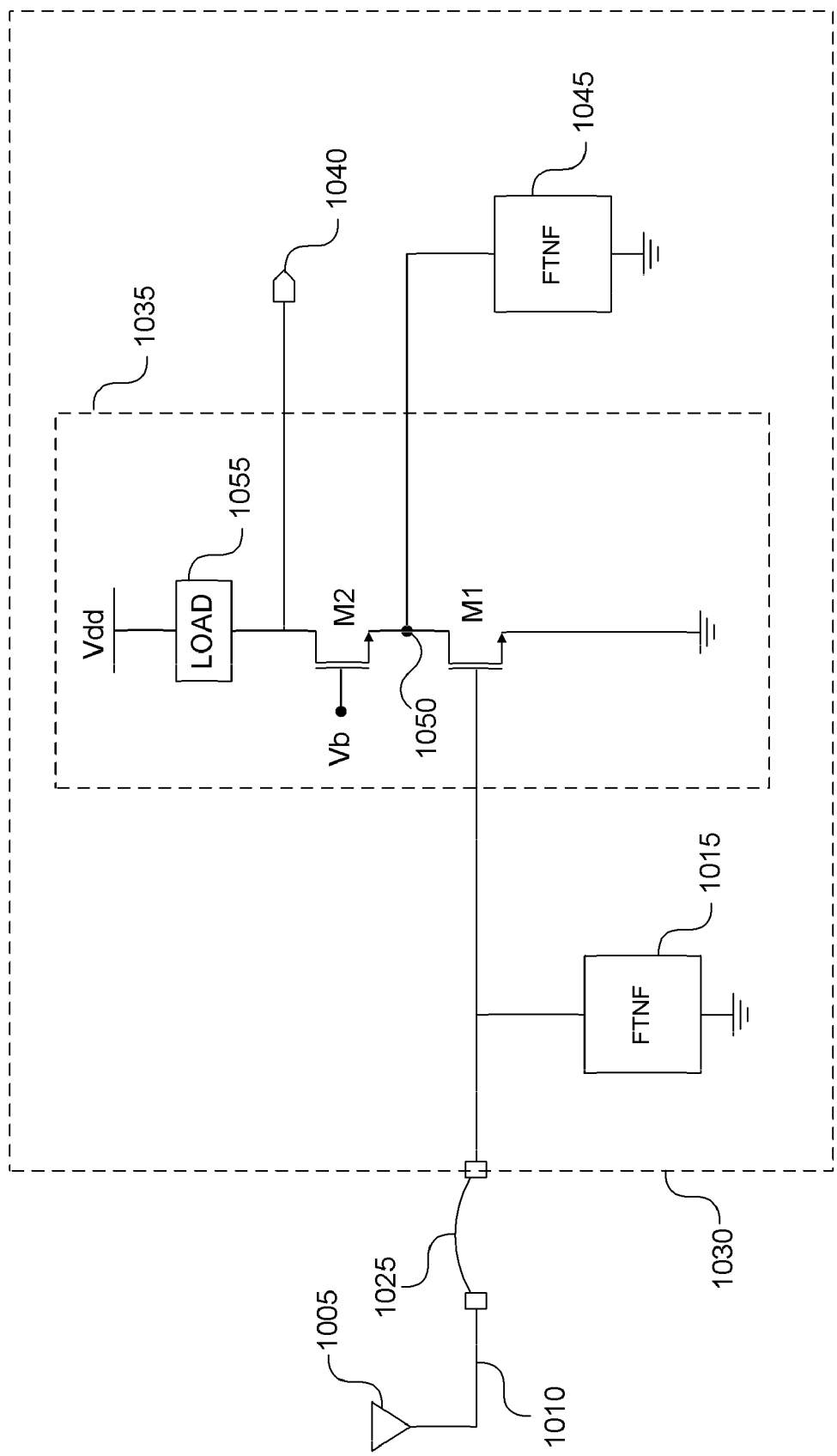
FIG. 10 illustrates a portion of an exemplary RF receiver that provides for suppression of out-of-band interferers on a semiconductor substrate using two single-ended frequency translated notch filters (FTNF), according to embodiments of the present invention.

FIG. 10 illustrates a portion of an exemplary RF receiver 1000 that provides for suppression of out-of-band interferers on a semiconductor substrate, according to embodiments of the present invention. Specifically, RF receiver 1000 includes an antenna 1005, a first frequency translated notch filter (FTNF) 1015, a common-source LNA 1035, and a second FTNF 1045. In an embodiment, FTNF 1015 and FTNF 1045 take the form of single-ended FTNF 400 described above in FIG. 4.

In reference to FIG. 10, RF receiver 1000 receives at an antenna 1005 an RF signal 1010 that includes a desired channel. In an embodiment, the desired channel is positioned within a frequency band defined by a particular communications standard. For example, the desired channel can be positioned within a frequency band defined by the GSM standard, such as the Global System for Mobile Communications 900 (GSM-900) band, the Digital Cellular System 1800 (DCS-1800) band, or the Personal Communications Services 1900 (PCS-1900) band.

Before undergoing substantive processing by RF receiver 1000, RF signal 1010 is provided to FTNF 1015 to attenuate out-of-band interferers. Specifically, RF signal 1010 is provided to FTNF 1015, implemented on semiconductor substrate 1030, via bond wire 1025. In general, FTNF 1015 functions to attenuate out-of-band interferers in the same manner as FTNF 815 as described above in FIG. 8. It should be noted that the 25% duty cycle LO signal used to tune FTNF 1015 has been omitted from the illustration of FIG. 10 for clarity sake.

Since out-of-band interferers will not develop any substantial voltage across the impedance provided by FTNF 1015 they will be attenuated. Signals outside the pass-bands of FTNF 1015, however, will develop a voltage across the impedance provided by FTNF 1015 and will be provided to common-source LNA 1035 for further processing.

Common-source LNA 1035 provides sufficient amplification of the desired channel to overcome the noise of subsequent stages. Common-source LNA 1035 includes a first field effect transistor (FET) M1 coupled at its gate to RF signal 1010. In an embodiment, RF signal 1010 can be coupled to the gate of M1 through an impedance, such as an inductor. The source of M1, although illustrated as being simply coupled to ground, can further be coupled through an impedance, such as an inductor, to ground. The drain of M1 is coupled to the source of a second FET M2 at a node 1050. M2 is biased at its gate via bias voltage Vb. In an embodiment, M2 is used to maximize gain and provide reverse isolation. The drain of M2 is coupled through a load 1055 to a supply voltage $V_{DD}$. Load 1055 includes any one of a resistor, inductor, capacitor, or any combination thereof. An amplified RF signal 1040 is provided at the drain of M2. The amplified RF signal 1040 can be subsequently processed by one or more down-conversion stages (not shown) to provide a final baseband signal.

As further illustrated by FIG. 10, additional FTNF 1045 can be used to attenuate any residual out-of-band interferers. Specifically, FTNF 1045 is coupled to node 1050 to attenuate any residual out-of-band interferers before reaching the output of common-source LNA 1035. In an embodiment FTNF 1015 and FTNF 1045 are configured in substantially the same manner and are tuned with a common 25% duty-cycle LO signal (not shown). In a further embodiment, FTNF 1015 and FTNF 1045 are independently controlled and can be deactivated (e.g., gated) when not necessary for operation. For example, if in operation of RF receiver 1000 FTNF 1015 is determined to provide adequate suppression of out-of-band interferes, FTNF 1045 can be gated to prevent any unnecessary power consumption.

It should be further noted that common-source LNA 1035 represents one exemplary single-ended LNA. As would be appreciated by one of ordinary skill in the art, other various single-ended LNA configurations can be used without departing from the scope and spirit of the present invention.

Figure 11:
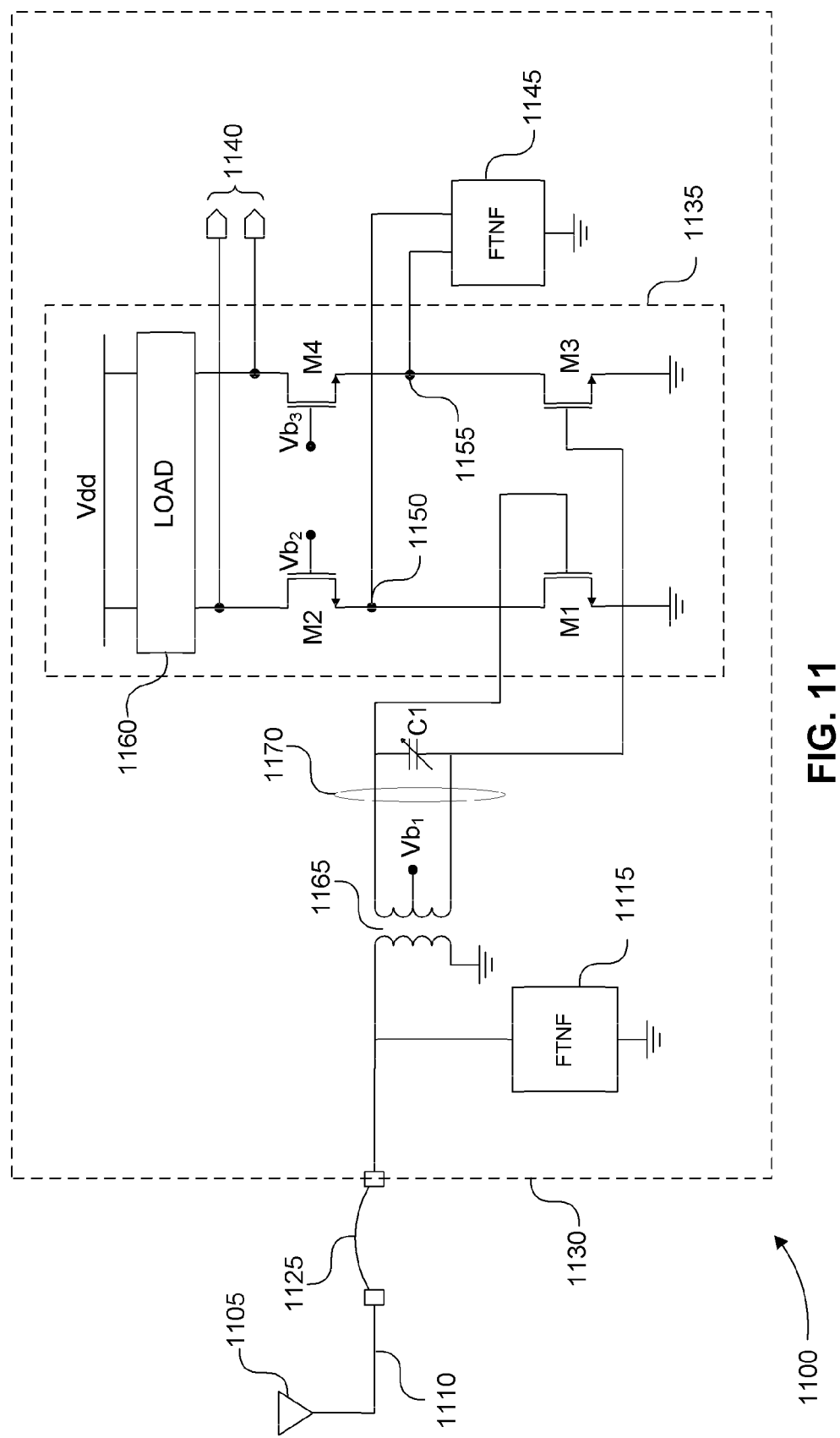
FIG. 11 illustrates a portion of an exemplary RF receiver that provides for suppression of out-of-band interferers on a semiconductor substrate using a single-ended and differential frequency translated notch filter (FTNF), according to embodiments of the present invention.

FIG. 11 illustrates a portion of an exemplary RF receiver 1100 that provides for suppression of out-of-band interferers on a semiconductor substrate, according to embodiments of the present invention. Specifically, RF receiver 1100 includes an antenna 1105, a single-ended frequency translated notch filter (FTNF) 1115, a balun transformer 1165, a common-source LNA 1135, and a differential FTNF 1145. In an embodiment, FTNF 1115 takes the form of single-ended FTNF 400 described above in FIG. 4, and FTNF 1145 takes the form of differential FTF 600 described above in FIG. 6.

In reference to FIG. 11, RF receiver 1100 receives at an antenna 1105 an RF signal 1110 that includes a desired channel. In an embodiment, the desired channel is positioned within a frequency band defined by a particular communications standard. For example, the desired channel can be positioned within a frequency band defined by the GSM standard, such as the Global System for Mobile Communications 900 (GSM-900) band, the Digital Cellular System 1800 (DCS-1800) band, or the Personal Communications Services 1900 (PCS-1900) band.

Before undergoing substantive processing by RF receiver 1100, RF signal 1110 is provided to FTNF 1115 to attenuate out-of-band interferers. Specifically, RF signal 1110 is provided to FTNF 1115, implemented on semiconductor substrate 1130, via bond wire 1125. In general, FTNF 1115 functions to attenuate out-of-band interferers in the same manner as FTNF 815 as described above in FIG. 8. It should be noted that the 25% duty cycle LO signal used to tune FTNF 1115 has been omitted from the illustration of FIG. 11 for clarity sake.

Since out-of-band interferers will not develop any substantial voltage across the impedance provided by FTNF 1115, they will be attenuated. Signals outside the pass-bands of FTNF 1115, however, will develop a voltage across the impedance provided by FTNF 1115 and will be provided to balun transformer 1165.

Balun transformer 1165 takes the single-ended filtered RF signal 1110 and transforms it to a differential RF signal 1170. In an embodiment, bias voltage $V_{b1}$ is capacitively coupled to ground potential. Common-source LNA 1135 receives differential RF signal 1170 and provides sufficient amplification of the desired channel to overcome the noise of subsequent stages.

Common-source LNA 1135 includes a first field effect transistor (FET) M1 coupled at its gate to the positive end of differential RF signal 1170. In an embodiment, RF input signal 1170 can be coupled to the gate of M1 through an impedance, such as an inductor. The source of M1, although illustrated as being simply coupled to ground, can further be coupled through an impedance, such as an inductor, to ground. The drain of M1 is coupled to the source of a second FET M2 at a node 1150. M2 is biased at its gate via bias voltage $Vb_2$. In an embodiment, M2 is used to maximize gain and provide reverse isolation. The drain of M2 is coupled through a load 1160 to a supply voltage $V_{DD}$. Load 1160 includes any one of a resistor, inductor, capacitor, or any combination thereof. A positive end of a differential amplified RF signal 1140 is provided at the drain of M2.

Common-source LNA 1135 further includes a third FET M3 coupled at its gate to the negative end of differential RF signal 1170. In an embodiment, RF input signal 1170 can be coupled to the gate of M3 through an impedance, such as an inductor. The source of M3, although illustrated as being simply coupled to ground, can further be coupled through an impedance, such as an inductor, to ground. The drain of M3 is coupled to the source of a fourth FET M4 at a node 1155. M4 is biased at its gate via bias voltage $Vb_3$. In an embodiment, M4 is used to maximize gain and provide reverse isolation. The drain of M4 is coupled through a load 1160 to a supply voltage $V_{DD}$. Load 1160, as noted above, includes any one of a resistor, inductor, capacitor, or any combination thereof. A negative end of a differential amplified RF signal 1140 is provided at the drain of M4.

After amplification, the amplified RF signal 1140 is subsequently processed by one or more down-conversion stages (not shown) to provide a final baseband signal.

As further illustrated by FIG. 11, additional FTNF 1145 can be used to attenuate any residual out-of-band interferers. Specifically, FTNF 1145 is differentially coupled to nodes 1150 and 1155 to attenuate any residual out-of-band interferers before reaching the output of common-source LNA 1135. In an embodiment FTNF 1115 and FTNF 1145 are configured in substantially the same manner and are tuned with a common 25% duty-cycle LO signal (not shown). In a further embodiment, FTNF 1115 and FTNF 1145 are independently controlled and can be deactivated (e.g., gated) when not necessary for operation. For example, if in operation of RF receiver 1100 FTNF 1115 is determined to provide adequate suppression of out-of-band interferes, FTNF 1145 can be gated to prevent any unnecessary power consumption.

It should be further noted that common-source LNA 1135 represents one exemplary differential LNA. As would be appreciated by one of ordinary skill in the art, other various differential LNA configurations can be used without departing from the scope and spirit of the present invention. For example, a noise-cancelled LNA can be used having a common-gate stage to provide impedance matching (typically 50 ohms to match the RF antenna) and a common-source stage to match the noise produced by the common-gate stage. The common-source stage can have a large transconductance such that the noise-cancelled LNA provides a good noise figure along with good impedance matching. The output of the noise-cancelled LNA is taken differentially at the output of the common-gate stage and the common-source stage. Because the noise of the common-gate stage is substantially matched by the common-source stage the noise appears common mode in the differential output signal and is effectively cancelled. In general, because Noise-cancelled LNAs have wide-band matching capabilities that are suitable for use in wide-band applications.

Figure 12:
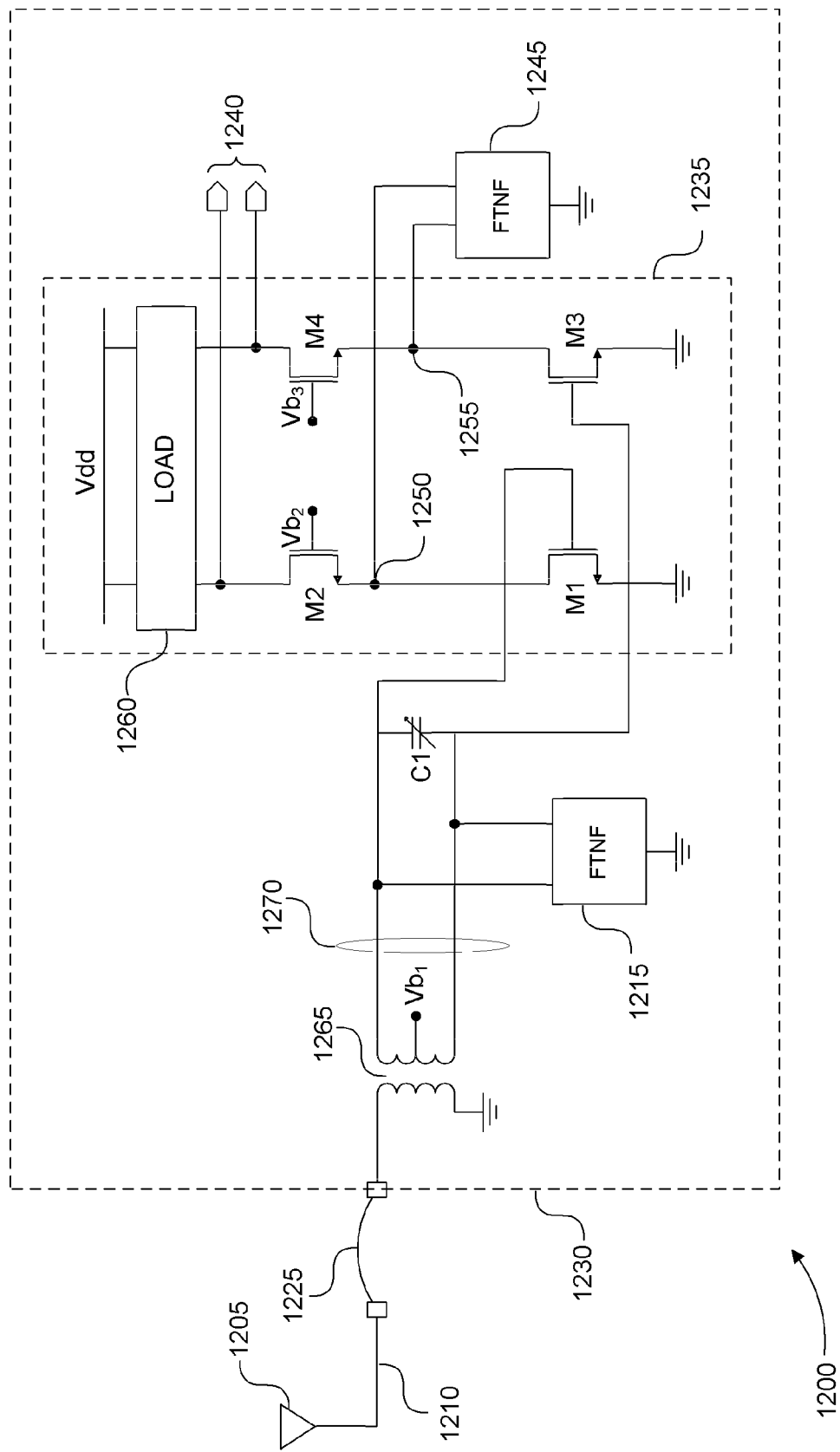
FIG. 12 illustrates a portion of an exemplary RF receiver that provides for suppression of out-of-band interferers on a semiconductor substrate using two differential frequency translated notch filters (FTNF), according to embodiments of the present invention.

FIG. 12 illustrates a portion of an exemplary RF receiver 1200 that provides for suppression of out-of-band interferers on a semiconductor substrate, according to embodiments of the present invention. Specifically, RF receiver 1200 includes an antenna 1205, a balun transformer 1265, a differential frequency translated notch filter (FTNF) 1215, a common-source LNA 1235, and a differential FTNF 1245. In an embodiment, FTNF 1215 and FTNF 1245 takes the form of differential FTF 600 described above in FIG. 6.

In reference to FIG. 12, RF receiver 1200 receives at an antenna 1205 an RF signal 1210 that includes a desired channel. In an embodiment, the desired channel is positioned within a frequency band defined by a particular communications standard. For example, the desired channel can be positioned within a frequency band defined by the GSM standard, such as the Global System for Mobile Communications 900 (GSM-900) band, the Digital Cellular System 1800 (DCS-1800) band, or the Personal Communications Services 1900 (PCS-1900) band.

Initially, RF signal 1210 is provided to Balun transformer 1265, implemented on semiconductor substrate 1230, via bond wire 1225. Balun transformer 1265 takes the single-ended RF signal 1210 and transforms it into a differential RF signal 1270. In an embodiment, bias voltage $V_{b1}$ is capacitively coupled to ground potential.

Differential RF signal 1270 is subsequently provided to FTNF 1215 to attenuate out-of-band interferers. Specifically, differential RF signal 1270 is provided to FTNF 1215, implemented on semiconductor substrate 1230. In general, FTNF 1215 functions to attenuate out-of-band interferers in the same manner as FTNF 815 as described above in FIG. 8. It should be noted that the 25% duty cycle LO signal used to tune FTNF 1215 has been omitted from the illustration of FIG. 12 for clarity sake. Since out-of-band interferers will not develop any substantial voltage across the impedance provided by FTNF 1215 they will be attenuated. Signals outside the pass-bands of FTNF 1215, however, will develop a voltage across the impedance provided by FTNF 1215 and will be provided to Common-source LNA 1235.

Common-source LNA 1235 receives differential RF signal 1270 and provides sufficient amplification to the desired channel to overcome the noise of subsequent stages.

Common-source LNA 1235 includes a first field effect transistor (FET) M1 coupled at its gate to the positive end of differential RF signal 1270. In an embodiment, RF input signal 1270 can be coupled to the gate of M1 through an impedance, such as an inductor. The source of M1, although illustrated as being simply coupled to ground, can further be coupled through an impedance, such as an inductor, to ground. The drain of M1 is coupled to the source of a second FET M2 at a node 1250. M2 is biased at its gate via bias voltage $Vb_2$. In an embodiment, M2 is used to maximize gain and provide reverse isolation. The drain of M2 is coupled through a load 1260 to a supply voltage $V_{DD}$. Load 1260 includes any one of a resistor, inductor, capacitor, or any combination thereof. A positive end of a differential amplified RF signal 1240 is provided at the drain of M2.

Common-source LNA 1235 further includes a third FET M3 coupled at its gate to the negative end of the differential RF signal 1270. In an embodiment, RF input signal 1270 can be coupled to the gate of M3 through an impedance, such as an inductor. The source of M3, although illustrated as being simply coupled to ground, can further be coupled through an impedance, such as an inductor, to ground. The drain of M3 is coupled to the source of a fourth FET M4 at a node 1255. M4 is biased at its gate via bias voltage Vb$_3$. In an embodiment, M4 is used to maximize gain and provide reverse isolation. The drain of M4 is coupled through a load 1260 to a supply voltage V$_{DD}$. Load 1260, as noted above, includes any one of a resistor, inductor, capacitor, or any combination thereof. A negative end of a differential amplified RF signal 1240 is provided at the drain of M4.

After amplification, the amplified RF signal 1240 is subsequently processed by one or more down-conversion stages (not shown) to provide a final baseband signal.

As further illustrated by FIG. 12, additional FTNF 1245 can be used to attenuate any residual out-of-band interferers. Specifically, FTNF 1245 is differentially coupled to nodes 1250 and 1255 to attenuate any residual out-of-band interferers before reaching the output of common-source LNA 1235. In an embodiment FTNF 1215 and FTNF 1245 are configured in substantially the same manner and are tuned with a common 25% duty-cycle LO signal (not shown). In a further embodiment, FTNF 1215 and FTNF 1245 are independently controlled and can be deactivated (e.g., gated) when not necessary for operation. For example, if in operation of RF receiver 1200 FTNF 1215 is determined to provide adequate suppression of out-of-band interferes, FTNF 1245 can be gated to prevent any unnecessary power consumption.

It should be further noted that common-source LNA 1235 represents one exemplary differential LNA. As would be appreciated by one of ordinary skill in the art, other various differential LNA configurations can be used without departing from the scope and spirit of the present invention.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A radio frequency (RF) receiver configured to receive and process an RF signal, the RF signal including a desired channel positioned within a particular frequency band, the RF receiver comprising:
   a low noise amplifier (LNA) coupled to the RF signal and configured to provide an amplified RF signal; and
   a frequency translated filter coupled between an input stage and a cascode stage of the LNA and configured to attenuate interferers in the RF signal outside the particular frequency band, the frequency translated filter comprising:
      a passive mixer configured to mix the RF signal received at a first mixer input and a local oscillator (LO) signal received at a second mixer input; and
      a baseband impedance coupled between an output of the passive mixer and ground,
      wherein the first mixer input presents a high-impedance path to ground for frequency components of the RF signal within the particular frequency band and a low-impedance path to ground for frequency components of the RF signal outside the particular frequency band.

2. The RF receiver of claim 1, wherein the LO signal has a duty cycle substantially equal to 25%.

3. The RF receiver of claim 2, wherein the LO signal comprises an in-phase LO signal and a quadrature LO signal.

4. The RF receiver of claim 3, wherein the passive mixer comprises:
   a first single-balanced mixer configured to mix the in-phase LO signal and the RF signal; and
   a second single-balanced mixer configured to mix the quadrature LO signal and the RF signal.

5. The RF receiver of claim 3, wherein the passive mixer comprises:
   a first double-balanced mixer configured to mix the in-phase LO signal and the RF signal; and
   a second double-balanced mixer configured to mix the quadrature LO signal and the RF signal.

6. The RF receiver of claim 2, wherein an impedance seen by the RF signal at the first mixer input is substantially equal to the baseband impedance translated in frequency by a frequency of the LO signal.

7. The RF receiver of claim 6, wherein the impedance seen by the RF signal at the first mixer input is substantially given by:

$$Z_{IN}(j\omega_{RF}) = R_{SW} + 2/\pi^2 \{Z_{BB}(j\omega_{RF} - j\omega_{LO}) + Z_{BB}(j\omega_{RF} + j\omega_{LO})\}$$

wherein:
   $Z_{IN}$ is the translated baseband impedance;
   $Z_{BB}$ is the baseband impedance;
   $\omega_{RF}$ is the frequency of the RF signal;
   $\omega_{LO}$ is the frequency of the LO signal; and
   $R_{SW}$ is the switch resistance of a switching device used in the passive mixer.

8. The RF receiver of claim 6, wherein the baseband impedance comprises at least one of a capacitor and an inductor.

9. The RF receiver of claim 8, wherein the baseband impedance forms a low quality factor (low-Q) filter.

10. The RF receiver of claim 9, wherein the translated baseband impedance seen by the RF signal at the first mixer input forms a high quality factor (high-Q) filter.

11. The RF receiver of claim 10, wherein the high-Q filter is a notch filter.

12. The RF receiver of claim 11, wherein the center frequency of the high-Q filter is determined by the frequency of the LO signal.

13. A radio frequency (RF) receiver configured to receive and process an RF signal, the RF signal including a desired channel positioned within a particular frequency band, the RF receiver comprising:
   a passive mixer configured to mix the RF signal received at a first mixer input and a local oscillator (LO) signal received at a second mixer input; and
   a baseband impedance coupled between an output of the passive mixer and ground,
   wherein the first mixer input is coupled between an input stage and a cascode stage of an LNA and presents a high-impedance path to ground for frequency components of the RF signal within the particular frequency band and a low-impedance path to ground for frequency components of the RF signal outside the particular frequency band.

14. The RF receiver of claim 13, wherein the LO signal has a duty cycle substantially equal to 25%.

15. The RF receiver of claim 14, wherein the LO signal comprises an in-phase LO signal and a quadrature LO signal.

16. The RF receiver of claim 15, wherein the passive mixer comprises:
   a first single-balanced mixer configured to mix the in-phase LO signal and the RF signal; and
   a second single-balanced mixer configured to mix the quadrature LO signal and the RF signal.

17. The RF receiver of claim 15, wherein the passive mixer comprises:
   a first double-balanced mixer configured to mix the in-phase LO signal and the RF signal; and
   a second double-balanced mixer configured to mix the quadrature LO signal and the RF signal.

18. The RF receiver of claim 14, wherein an impedance seen by the RF signal at the first mixer input is substantially equal to the baseband impedance translated in frequency by a frequency of the LO signal.

19. The RF receiver of claim 18, wherein the impedance seen by the RF signal at the first mixer input is substantially given by:

$$Z_{IN}(j\omega_{RF}) = R_{SW} + \frac{2}{\pi^2}\{Z_{BB}(j\omega_{RF} - j\omega_{LO}) + Z_{BB}(j\omega_{RF} + j\omega_{LO})\}$$

wherein:
$Z_{IN}$ is the translated baseband impedance;
$Z_{BB}$ is the baseband impedance;
$\omega_{RF}$ is the frequency of the RF signal;
$\omega_{LO}$ is the frequency of the LO signal; and
$R_{SW}$ is the switch resistance of a switching device used in the passive mixer.

20. The RF receiver of claim 18, wherein the baseband impedance comprises at least one of a capacitor and an inductor.

21. The RF receiver of claim 20, wherein the baseband impedance forms a low quality factor (low-Q) filter.

22. The RF receiver of claim 21, wherein the translated baseband impedance seen by the RF signal at the first mixer input forms a high quality factor (high-Q) filter.

23. The RF receiver of claim 22, wherein the high-Q filter is a notch filter.

24. The RF receiver of claim 23, wherein the center frequency of the high-Q filter is determined by the frequency of the LO signal.

25. The RF receiver of claim 24, wherein the LO signal has a frequency substantially equal to a center frequency of the desired channel.

26. The RF receiver of claim 24, wherein the LO signal has a frequency substantially equal to a center frequency of the particular frequency band.

27. The RF receiver of claim 23, wherein the high-Q filter presents a high-impedance path to ground for the desired channel and a low-impedance path to ground for the interferers outside the particular frequency band.

28. The RF receiver of claim 13, wherein the particular frequency band is defined by a communications standard.

29. A frequency translated filter, comprising:
   a passive mixer configured to mix a radio frequency (RF) signal received at a first mixer input and a local oscillator (LO) signal received at a second mixer input; and
   a baseband impedance coupled between an output of the passive mixer and ground,
   wherein the first mixer input presents a high-impedance path to ground for frequency components of the RF signal within a desired frequency band and a low-impedance path to ground for frequency components of the RF signal outside the desired frequency band,
   wherein an impedance seen by the RF signal at the first mixer input is substantially equal to the baseband impedance translated in frequency by a frequency of the LO signal and is substantially given by:

$$Z_{IN}(j\omega_{RF}) = R_{SW} + \frac{2}{\pi^2}\{Z_{BB}(j\omega_{RF} - j\omega_{LO}) + Z_{BB}(j\omega_{RF} + j\omega_{LO})\}$$

wherein:
$Z_{IN}$ is the translated baseband impedance;
$Z_{BB}$ is the baseband impedance;
$\omega_{RF}$ is the frequency of the RF signal;
$\omega_{LO}$ is the frequency of the LO signal; and
$R_{SW}$ is the switch resistance of a switching device used in the passive mixer.

* * * * *